US012813292B2

(12) United States Patent
Adachi

(10) Patent No.: US 12,813,292 B2
(45) Date of Patent: Nov. 24, 2026

(54) SEMICONDUCTOR DEVICE

(71) Applicant: FUJI ELECTRIC CO., LTD., Kawasaki (JP)

(72) Inventor: Shinichiro Adachi, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 555 days.

(21) Appl. No.: 18/453,713

(22) Filed: Aug. 22, 2023

(65) Prior Publication Data

US 2024/0096764 A1 Mar. 21, 2024

(30) Foreign Application Priority Data

Sep. 20, 2022 (JP) ................................ 2022-149271

(51) Int. Cl.
*H10W 70/40* (2026.01)
*G01R 15/20* (2006.01)
(Continued)

(52) U.S. Cl.
CPC ........ *H10W 70/481* (2026.01); *G01R 15/202* (2013.01); *H01F 17/04* (2013.01); (Continued)

(58) Field of Classification Search
CPC .................................................. G01R 15/202
See application file for complete search history.

(56) References Cited

U.S. PATENT DOCUMENTS 10,175,269 B2 * 1/2019 Oka ...................... H02M 7/003
11,506,729 B2 * 11/2022 Hirano ............... G01R 33/0011
(Continued)

FOREIGN PATENT DOCUMENTS

JP 2007028785 A 2/2007
JP 2008016770 A 1/2008
(Continued)

OTHER PUBLICATIONS

Office Action issued for corresponding Japanese patent application No. 2022-149271, and its English translation, dated Jul. 28, 2026.

*Primary Examiner* — Dale E Page
*Assistant Examiner* — Rohit Parthasarathy
(74) *Attorney, Agent, or Firm* — Rabin & Berdo, P.C.

(57) ABSTRACT

A semiconductor device includes an insulated circuit board having a semiconductor chip thereon, a W-phase output terminal electrically connected to the chip, a cooling device including a cooling top plate having a top surface on which the insulated circuit board is disposed, and a case including a frame portion on the cooling top plate and having an open storage area in which the insulated circuit board is stored, and a current detection unit for detecting an output current flowing through the output terminal. The output terminal extends from the unit storage portion to an outside the case and passes through the current detection unit. The current detection unit is embedded within the frame portion such that a shortest external dimension thereof is parallel to a first direction that is perpendicular to the top surface in the cooling area of the cooling top plate.

8 Claims, 14 Drawing Sheets

(51) Int. Cl.

| | |
|---|---|
| ***H01F 17/04*** | (2006.01) |
| ***H10W 40/22*** | (2026.01) |
| ***H10W 40/40*** | (2026.01) |
| ***H10W 70/685*** | (2026.01) |
| ***H10W 72/00*** | (2026.01) |
| ***H10W 76/15*** | (2026.01) |
| ***H10W 90/00*** | (2026.01) |

(52) U.S. Cl.
CPC ......... *H10W 40/226* (2026.01); *H10W 40/40* (2026.01); *H10W 70/685* (2026.01); *H10W 76/15* (2026.01); *H10W 72/886* (2026.01); *H10W 90/734* (2026.01); *H10W 90/765* (2026.01)

(56) References Cited

U.S. PATENT DOCUMENTS

| | | | | |
|---|---|---|---|---|
| 2004/0042172 | A1* | 3/2004 | Kusaka ................. | G06F 1/1616 361/699 |
| 2006/0232942 | A1* | 10/2006 | Nakatsu .................. | B60L 50/13 361/710 |
| 2008/0048642 | A1* | 2/2008 | Aratani ................ | G01R 33/077 324/117 H |
| 2012/0187945 | A1* | 7/2012 | Ogimoto .............. | G01R 15/148 324/244 |
| 2015/0008574 | A1* | 1/2015 | Gohara ................. | H10W 40/47 257/714 |
| 2015/0380338 | A1* | 12/2015 | Hori .................... | H10W 40/255 257/693 |
| 2016/0129792 | A1* | 5/2016 | Gohara ................... | B23P 15/26 29/890.035 |
| 2017/0077835 | A1* | 3/2017 | Hirakata ............. | H02M 7/5387 |
| 2018/0321283 | A1* | 11/2018 | Sei ........................... | G01R 3/00 |
| 2019/0148265 | A1* | 5/2019 | Kitamura .......... | H10W 20/4403 257/714 |
| 2020/0098667 | A1* | 3/2020 | Adachi ................... | F28F 27/00 |
| 2020/0132736 | A1* | 4/2020 | Fujioka .................. | G01R 19/25 |
| 2020/0170147 | A1* | 5/2020 | Arai ........................ | B60R 16/02 |
| 2020/0187385 | A1* | 6/2020 | Olesen ............... | H05K 7/20254 |
| 2020/0400721 | A1* | 12/2020 | Suzuki ................. | G01R 15/205 |
| 2022/0122902 | A1 | 4/2022 | Adachi et al. | |

FOREIGN PATENT DOCUMENTS

| | | | |
|---|---|---|---|
| JP | 2015076933 | A | 4/2015 |
| JP | 2018121418 | A | 8/2018 |
| JP | 2020092250 | A | 6/2020 |
| JP | 2021023029 | A | 2/2021 |
| JP | 2022065238 | A | 4/2022 |

* cited by examiner

SEMICONDUCTOR DEVICE

CROSS-REFERENCE TO RELATED APPLICATION

This application is based upon and claims the benefit of priority of the prior Japanese Patent Application No. 2022-149271, filed on Sep. 20, 2022, the entire contents of which are incorporated herein by reference.

BACKGROUND OF THE INVENTION

1. Field of the Invention

The embodiments discussed herein relate to a semiconductor device.

2. Background of the Related Art

A semiconductor device includes a semiconductor module and a cooling device. The semiconductor module includes power devices and constitutes, for example, an inverter. The power devices are, for example, insulated gate bipolar transistors (IGBTs) and power metal-oxide-semiconductor field-effect transistors (MOSFETs). The semiconductor module includes semiconductor chips including power devices and an insulated circuit board on which the semiconductor chips are disposed, and these components are stored in a case. Refrigerant flows inside the cooling device. The cooling device consequently cools the semiconductor module generating heat, thereby maintaining the reliability of the semiconductor module (for example, see Japanese Laid-open Patent Publication No. 2020-092250).

In addition, current sensors (current detection units) are included in the case of the semiconductor module. The current sensors are electrically connected to the semiconductor chips. The output currents outputted from the semiconductor chips flow through external terminals and are detected (for example, see Japanese Laid-open Patent Publication No. 2018-121418).

To reduce the size of a semiconductor device, its semiconductor module needs to be thinned, for example. However, since the case of the semiconductor module includes a current detection unit, there is a limit to thinning of the semiconductor module.

SUMMARY OF THE INVENTION

In one aspect of the embodiments, there is provided a semiconductor device including: a semiconductor chip having an output electrode on a front surface thereof; an insulated circuit board having the semiconductor chip disposed on a front surface thereof; an output terminal electrically connected to the output electrode; a cooling device including a cooling top plate having a cooling top surface and a cooling bottom surface, the cooling top surface having a cooling area on which the insulated circuit board is disposed; and a case including a frame portion having a frame shape in a plan view of the semiconductor device and being disposed on the cooling top surface, the frame portion including an open storage area in which the insulated circuit board is stored, the output terminal extending from the storage area to an outside of the case; and a current detection unit for detecting an output current flowing through the output terminal, the current detection unit being embedded within the frame portion such that a shortest external dimension of the current detection unit is parallel to a first direction that is perpendicular to the cooling area of the cooling top surface.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, embodiments will be described with reference to the accompanying drawings. In the following description, regarding a semiconductor device 1 in FIG. 1, terms "front surface" and "top surface" each express an X-Y surface facing upward (the +Z direction). Likewise, regarding the semiconductor device 1 in FIG. 1, a term "up" expresses the upper direction (the +Z direction). Regarding the semiconductor device 1 in FIG. 1, terms "rear surface" and "bottom surface" each express an X-Y surface facing downward (the −Z direction). Likewise, regarding the semiconductor device 1 in FIG. 1, a term "down" expresses the lower direction (the −Z direction). In all the other drawings, the above terms mean their respective directions as needed. The terms "front surface", "top surface", "up", "rear surface", "bottom surface", "down", and "side surface" are simply used as convenient expressions to determine relative positional relationships and do not limit the technical ideas of the embodiments. For example, the terms "up" and "down" may mean directions other than the vertical directions with respect to the ground. That is, the directions expressed by "up" and "down" are not limited to the directions relating to the gravitational force. In addition, in the following description, when a component contained in material represents 80 vol % or more of the material, this component will be referred to as "main component" of the material. In addition, an expression "approximately the same" may be used when an error between two elements is within in ±10%. In addition, even when two elements are not exactly perpendicular or parallel to each other, the two elements may be described as being "perpendicular" or "parallel" to each other if the error is within ±10°.

First Embodiment

Figure 1:
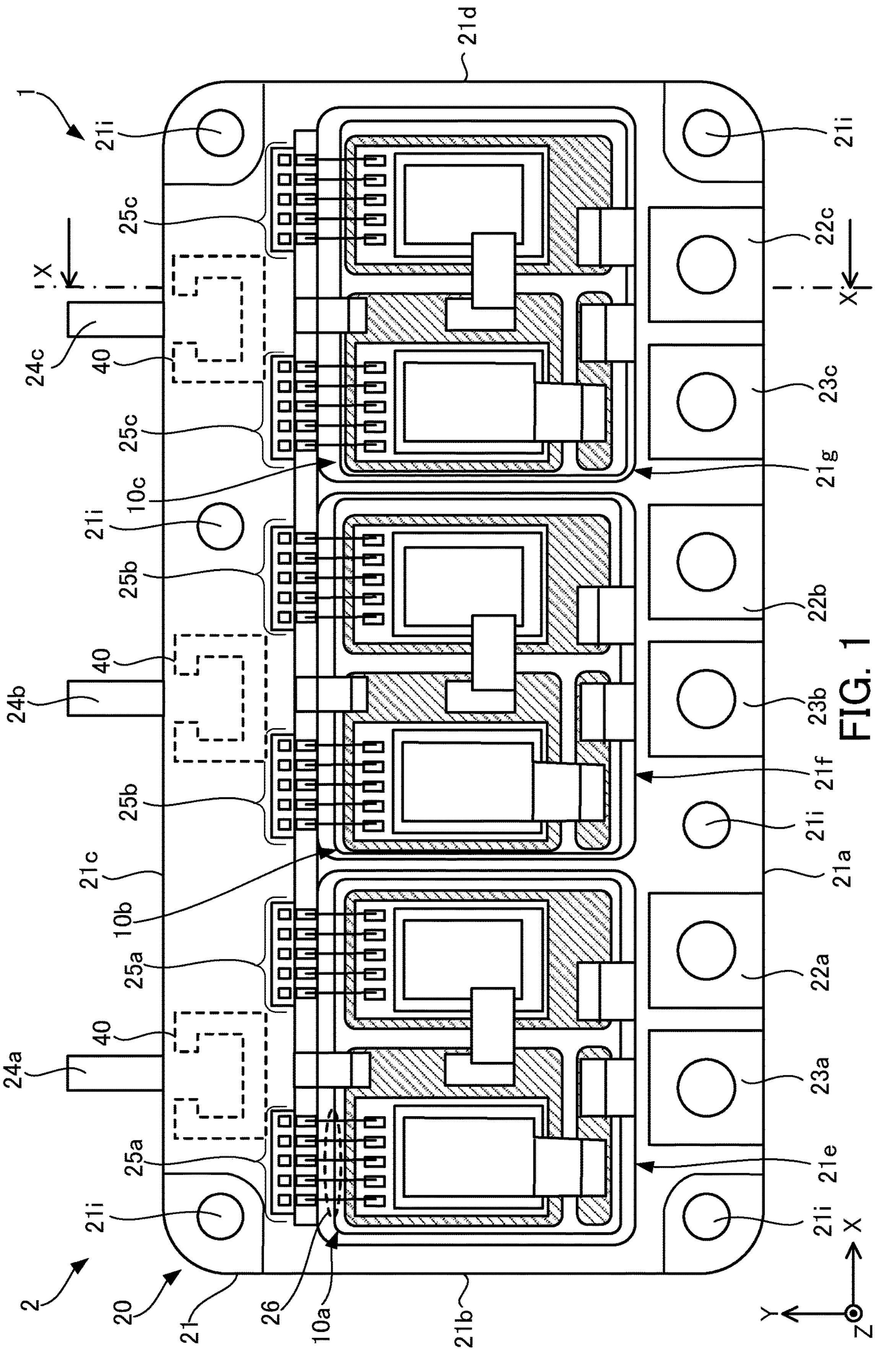
FIG. 1 is a plan view of a semiconductor device according to a first embodiment.
Figure 2:
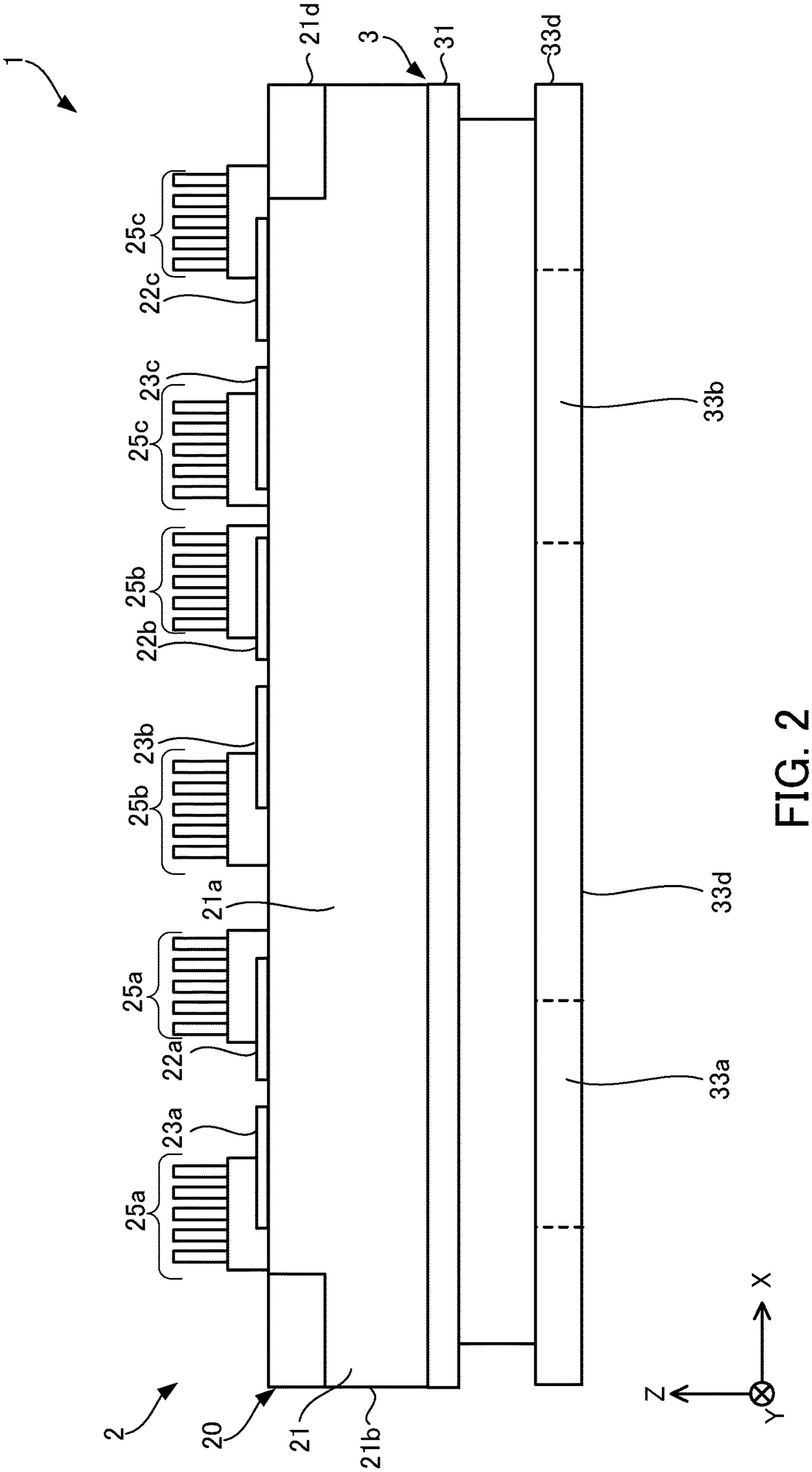
FIG. 2 is a side view of the semiconductor device according to the first embodiment.

A semiconductor device 1 according to a first embodiment will be described with reference to FIGS. 1 and 2. FIG. 1 is a plan view of the semiconductor device according to the first embodiment, and FIG. 2 is a side view of the semiconductor device according to the first embodiment. Specifically, FIG. 2 is a side view in which the X-Z plane in FIG. 1 is seen in the +Y direction.

The semiconductor device 1 includes a semiconductor module 2 and a cooling device 3. The semiconductor module 2 includes semiconductor units 10*a*, 10*b*, and 10*c* and a case 20 storing the semiconductor units 10*a*, 10*b*, and 10*c*. The semiconductor units 10*a*, 10*b*, and 10*c* stored in the case 20 are sealed by sealing material (not illustrated). Each of the semiconductor units 10*a*, 10*b*, and 10*c* has the same construction. When the semiconductor units 10*a*, 10*b*, and 10*c* are not distinguished from each other, any one of the semiconductor units 10*a*, 10*b*, and 10*c* will be described as a semiconductor unit 10. The semiconductor unit 10 will be described in detail below.

First, the case 20 includes a frame portion 21, first connection terminals 22*a*, 22*b*, and 22*c*, second connection terminals 23*a*, 23*b*, and 23*c*, a U-phase output terminal 24*a*, a V-phase output terminal 24*b*, and a W-phase output terminal 24*c*, and control terminals 25*a*, 25*b*, and 25*c*.

The frame portion 21 has an approximately rectangular shape in plan view, and four sides of the frame portion 21 constitute outer walls 21*a*, 21*b*, 21*c*, and 21*d*. The outer walls 21*a* and 21*c* constitute long sides of the frame portion 21, and the outer walls 21*b* and 21*d* constitute short sides of the frame portion 21. In addition, the frame portion 21 has corner portions, each of which is formed by connection of two of the outer walls 21*a*, 21*b*, 21*c*, and 21*d*. These corner portions may be right-angled corner portions or rounded corner portions as illustrated in FIG. 1. Through-holes 21*i*, each of which extends through the frame portion 21, are formed at the corner portions in the front surface of the frame portion 21. Each of the through-holes 21*i* at the corner portions of the frame portion 21 may be formed in a surface lower than the front surface of the frame portion 21.

The frame portion 21 includes unit storage portions 21*e*, 21*f*, and 21*g* along the outer walls 21*a* and 21*c* in the front surface. These unit storage portions 21*e*, 21*f*, and 21*g* are rectangular openings in plan view. The semiconductor units 10*a*, 10*b*, and 10*c* are stored in the unit storage portions 21*e*, 21*f*, and 21*g*, respectively. The frame portion 21 is attached to a top plate (cooling top plate) 31 of the cooling device 3. The top plate 31 has a cooling top surface 31*g* on which the semiconductor units 10*a*, 10*b*, and 10*c* are disposed, and a cooling bottom surface. After the frame portion 21 is attached to the top plate 31, the unit storage portions 21*e*, 21*f*, and 21*g* of the frame portion 21 surround (store) their respective semiconductor units 10*a*, 10*b*, and 10*c* lined on the cooling device 3. In addition, an inlet 33*a* and an outlet 33*b* are formed in a bottom surface 33*d* of the cooling device 3 (the surface opposite to the top plate 31 to which the semiconductor units 10 are attached). The cooling device 3 will be described in detail below.

The frame portion 21 includes the first connection terminals 22*a*, 22*b*, and 22*c* and the second connection terminals 23*a*, 23*b*, and 23*c* near the outer wall 21*a*, sandwiching the unit storage portions 21*e*, 21*f*, and 21*g* in the ±Y directions (second direction) in plan view. The first connection terminals 22*a*, 22*b*, and 22*c* and the second connection terminals 23*a*, 23*b*, and 23*c* each have one end, which is an outer end and appears on the front surface near the outer wall 21*a*. In addition, the first connection terminals 22*a*, 22*b*, and 22*c* and the second connection terminals 23*a*, 23*b*, and 23*c* each have the other end, which is an inner end and appears inside a corresponding one of the unit storage portions 21*e*, 21*f*, and 21*g*. These inner ends are electrically connected to their respective semiconductor units 10*a*, 10*b*, and 10*c*. The U-phase output terminal 24*a*, the V-phase output terminal 24*b*, and the W-phase output terminal 24*c* are formed near the outer wall 21*c*. The U-phase output terminal 24*a*, the V-phase output terminal 24*b*, and the W-phase output terminal 24*c* each have one end, which is an outer end and appears on the outer wall 21*c*. The U-phase output terminal 24*a*, the V-phase output terminal 24*b*, and the W-phase output terminal 24*c* each have the other end, which is an inner end and appears inside a corresponding one of the storage portions 21*e*, 21*f*, and 21*g*. These inner ends are electrically connected to their respective semiconductor units 10*a*, 10*b*, and 10*c*. Current sensors 40 are embedded into the frame portion 21 near the outer wall 21*c*, and each of the current sensors 40 is disposed for a corresponding one of the U-phase output terminal 24*a*, the V-phase output terminal 24*b*, and the W-phase output terminal 24*c*. In FIG. 1, the location of the individual current sensor 40 embedded into the frame portion 21 is indicated by a dashed line. These current sensors 40 are aligned with their respective U-phase output terminal 24*a*, V-phase output terminal 24*b*, and W-phase output terminal 24*c*. The current sensors 40 will be described in detail below.

In addition, the front surface of the frame portion 21 has areas that face the openings for the first connection terminals 22*a*, 22*b*, and 22*c* and the second connection terminals 23*a*, 23*b*, and 23*c*. In these areas, nuts facing the openings are stored.

In addition, the frame portion 21 includes the control terminals 25*a*, 25*b*, and 25*c* along the +Y direction sides of the unit storage portions 21*e*, 21*f*, and 21*g* (near the outer wall 21*c*), respectively, in plan view. The control terminals 25*a* are divided into two groups, and the same applies to the control terminals 25*b* and 25*c*. Each of the control terminals 25*a*, 25*b*, and 25*c* is formed in the shape of the letter "J" (or "U") and has one end extending vertically upward (in the +Z direction (first direction)) near the outer wall 21*c* of the frame portion 21. The other ends of the control terminals 25*a*, 25*b*, and 25*c* extend vertically upward (in the +Z direction) and appear in their respective unit storage portions 21*e*, 21*f*, and 21*g* near the outer wall 21*c*. The shape and the number of the control terminals 25*a*, 25*b*, and 25*c* may be modified as needed.

The frame portion 21 includes the first connection terminals 22*a*, 22*b*, and 22*c*, the second connection terminals 23*a*, 23*b*, and 23*c*, the U-phase output terminal 24*a*, the V-phase output terminal 24*b*, and the W-phase output terminal 24*c*, and the control terminals 25*a*, 25*b*, and 25*c*. The frame portion 21 and these components are integrally formed by injection molding with thermoplastic resin. The current sensors 40 may also be formed integrally with the frame portion 21. In this way, the case 20 is constructed. Examples of the thermoplastic resin include polyphenylene sulfide resin, polybutylene terephthalate resin, polybutylene succinate resin, polyamide resin, and acrylonitrile butadiene styrene resin.

In addition, the first connection terminals 22*a*, 22*b*, and 22*c*, the second connection terminals 23*a*, 23*b*, and 23*c*, the U-phase output terminal 24*a*, the V-phase output terminal 24*b*, the W-phase output terminal 24*c*, and the control terminals 25*a*, 25*b*, and 25*c* are each made of a metal material having an excellent electrical conductivity. For example, this metal material is copper, aluminum, or an alloy containing at least one of these kinds as its main component. The surface of each of the first connection terminals 22*a*, 22*b*, and 22*c*, the second connection terminals 23*a*, 23*b*, and 23*c*, the U-phase output terminal 24*a*, the V-phase output terminal 24*b*, and the W-phase output terminal 24*c*, and the control terminals 25*a*, 25*b*, and 25*c* may be plated. The material used for this plating is, for example, nickel, a nickel-phosphorus alloy, or a nickel-boron alloy.

The sealing material (not illustrated) for sealing the unit storage portions 21*e*, 21*f*, and 21*g* of the case 20 may be silicone gel or thermosetting resin. The thermosetting resin is, for example, epoxy resin, phenol resin, maleimide resin, or polyester resin. Preferably, the thermosetting resin is epoxy resin. In addition, filler may be added to the sealing material. The filler is an insulating ceramic material having a high thermal conductivity.

Figure 3:
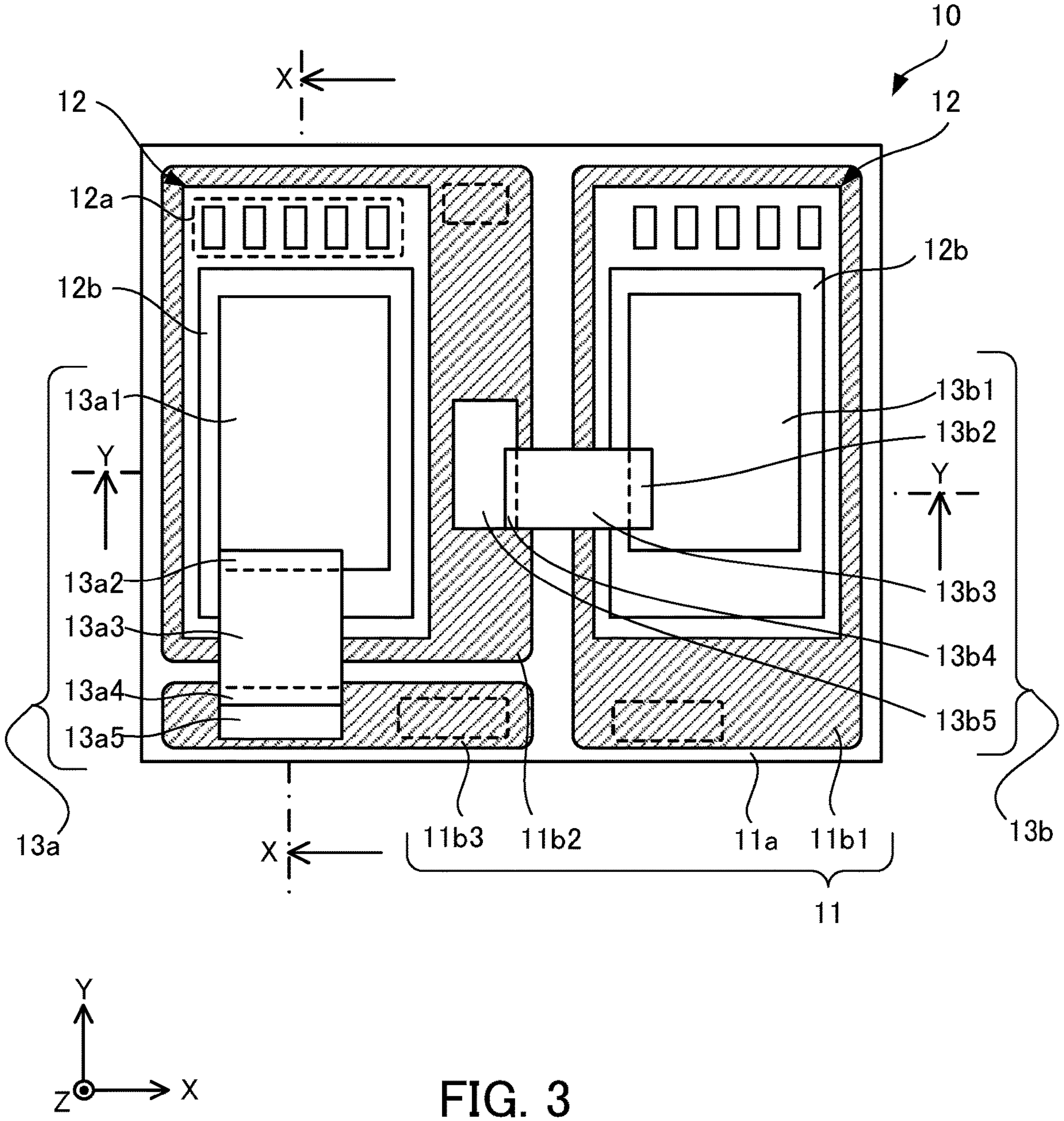
FIG. 3 is a plan view of a semiconductor unit included in the semiconductor device according to the first embodiment.
Figure 4:
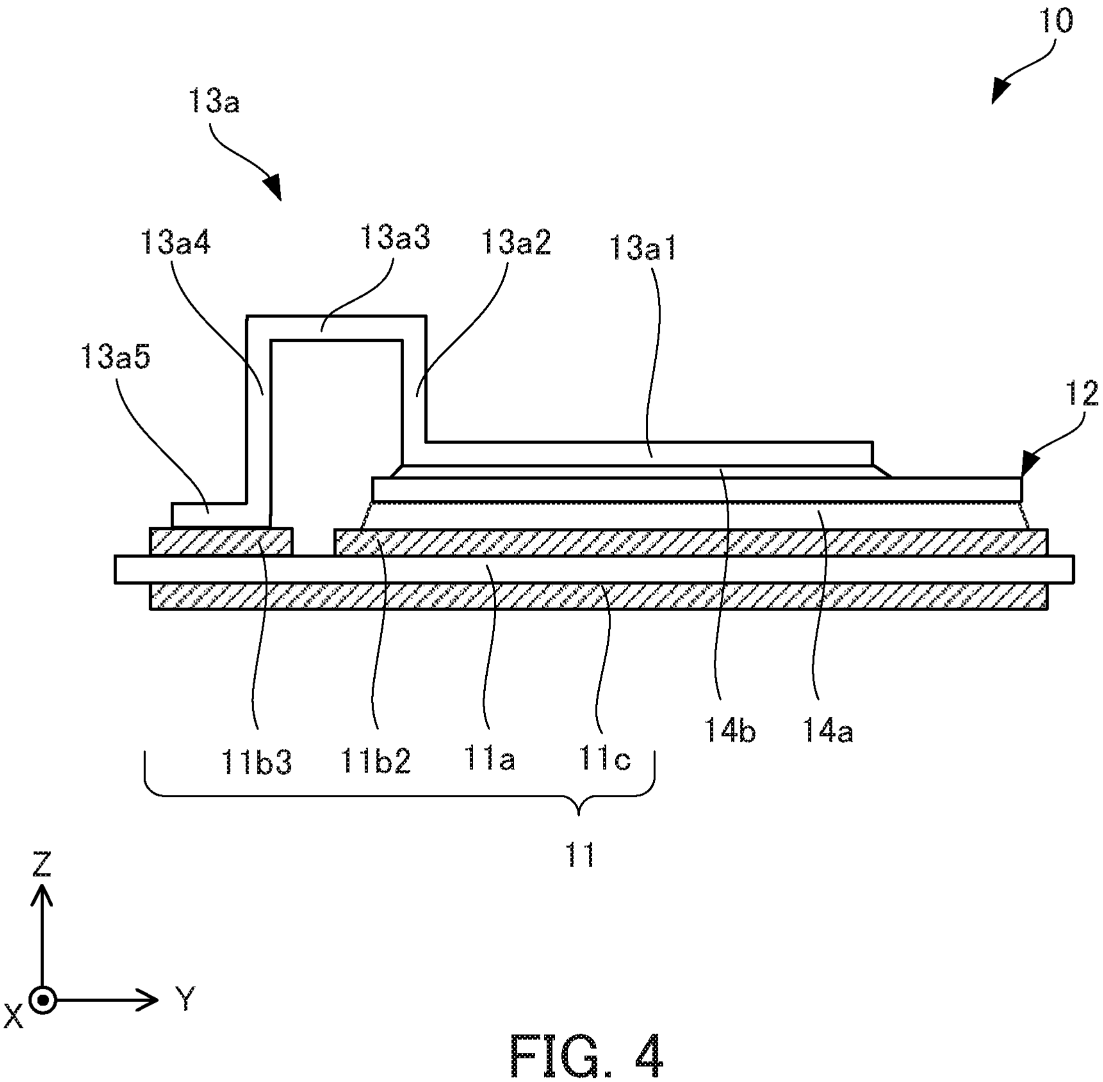
FIG. 4 is a first sectional view of the semiconductor unit included in the semiconductor device according to the first embodiment.
Figure 5:
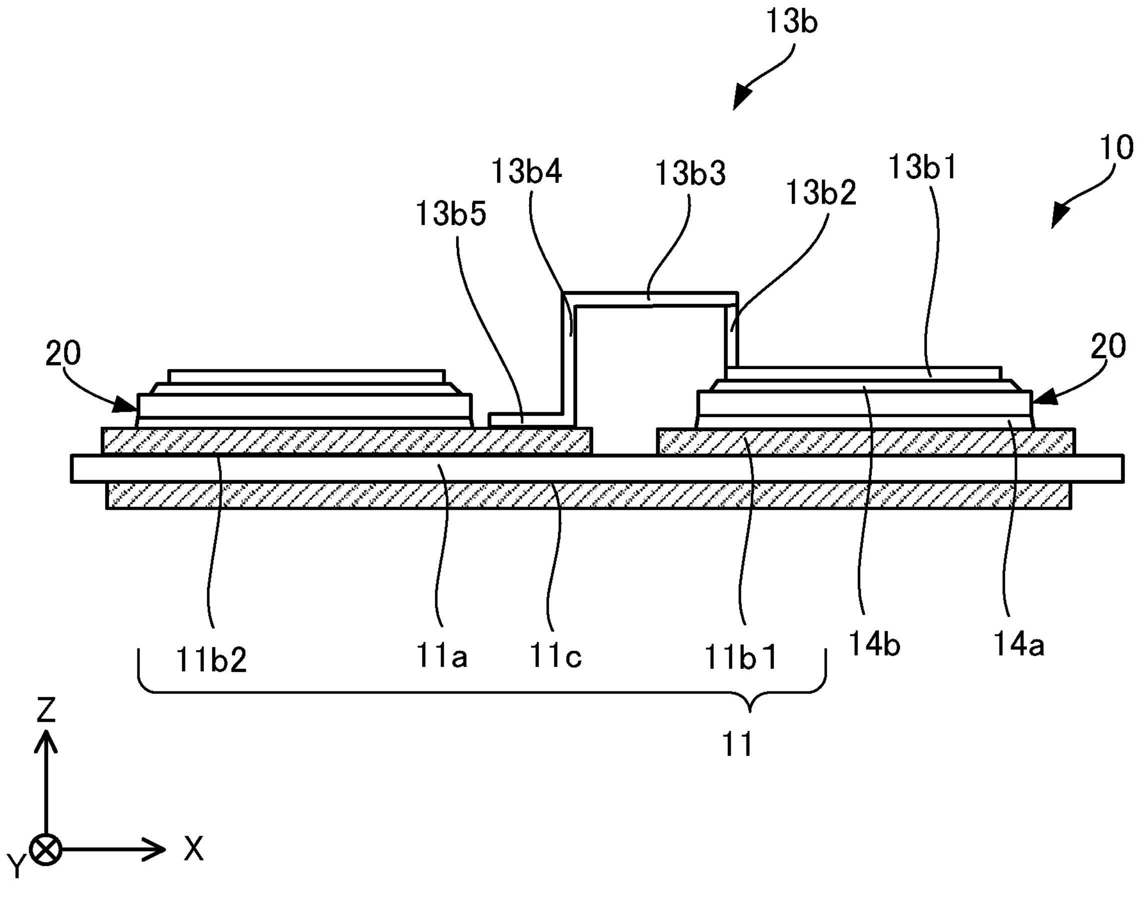
FIG. 5 is a second sectional view of the semiconductor unit included in the semiconductor device according to the first embodiment.

Next, the semiconductor units 10*a*, 10*b*, and 10*c* will be described with reference to FIGS. 3 to 5. FIG. 3 is a plan view of a semiconductor unit included in the semiconductor device according to the first embodiment. FIGS. 4 and 5 are each a sectional view of the semiconductor unit included in the semiconductor device according to the first embodiment. More specifically, FIG. 4 is a sectional view taken along a dashed-dotted line X-X in FIG. 3, and FIG. 5 is a sectional view taken along a dashed-dotted line Y-Y in FIG. 3.

The individual semiconductor unit 10 includes an insulated circuit board 11, two semiconductor chips 12, and lead frames 13*a* and 13*b*. The semiconductor chips 12 are bonded to the insulated circuit board 11 via a bonding material 14*a*. The lead frames 13*a* and 13*b* are each bonded to a main electrode on the front surface of a corresponding one of the semiconductor chips 12 via a bonding material 14*b*. The lead frames 13*a* and 13*b* may be bonded to the insulated circuit board 11 by ultrasonic bonding, instead of using the bonding material 14*b*.

The insulated circuit board 11 includes an insulating plate 11*a*, wiring plates 11*b*1, 11*b*2, and 11*b*3, and a metal plate 11*c*. The insulating plate 11*a* and the metal plate 11*c* each have a rectangular shape in plan view. Corner portions of the insulating plate 11*a* and the metal plate 11*c* may be rounded or chamfered. The metal plate 11*c* is smaller than the insulating plate 11*a* and is formed inside the insulating plate 11*a* in plan view.

The insulating plate 11*a* is made of an insulating material having an excellent thermal conductivity. The insulating plate 11*a* is made of a ceramic material, examples of which include aluminum oxide, aluminum nitride, and silicon nitride.

The wiring plates 11*b*1, 11*b*2, and 11*b*3 are formed on the front surface of the insulating plate 11*a*. The wiring plates 11*b*1, 11*b*2, and 11*b*3 are each made of a metal material having an excellent electrical conductivity. For example, this metal material is copper, aluminum, or an alloy containing at least one of these kinds as its main component. The wiring plates 11*b*1, 11*b*2, and 11*b*3 each have a thickness between 0.1 mm and 2.0 mm, inclusive. The surface of each of the wiring plates 11*b*1, 11*b*2, and 11*b*3 may be plated to improve its corrosion resistance. The material used for this plating is, for example, nickel, a nickel-phosphorus alloy, or a nickel-boron alloy.

The wiring plate 11*b*1 is formed on approximately one half of the area of the front surface of the insulating plate 11*a*, the area being located in the +X direction side of the insulating plate 11*a*. The area occupied by the wiring plate 11*b*1 ranges from the −Y direction side to the +Y direction side of the front surface of the insulating plate 11*a*. An area surrounded by a dashed line in the wiring plate 11*b*1 is bonded to an end of a corresponding one of the first connection terminals 22*a*, 22*b*, and 22*c*. This area surrounded by the dashed line in the wiring plate 11*b*1 may be bonded to an end of a corresponding one of the first connection terminals 22*a*, 22*b*, and 22*c* via an electrically conductive block member.

The wiring plate 11*b*2 is formed on approximately the other half of the area of the front surface of the insulating plate 11*a*, the area being located in the −X direction side of the insulating plate 11*a*. The area occupied by the wiring plate 11*b*2 ranges from the +Y direction side of the front surface of the insulating plate 11*a* to an area little before the −Y direction side of the front surface of the insulating plate 11*a*. An area surrounded by a dashed line in the wiring plate 11*b*2 is bonded to a corresponding one of the U-phase output terminal 24*a*, the V-phase output terminal 24*b*, and the W-phase output terminal 24*c*. This area surrounded by the dashed line in the wiring plate 11*b*2 may be bonded to a corresponding one of the U-phase output terminal 24*a*, the V-phase output terminal 24*b*, and the W-phase output terminal 24*c* via an electrically conductive block member.

The wiring plate 11*b*3 occupies an area surrounded by the wiring plates 11*b*1 and 11*b*2 on the front surface of the insulating plate 11*a*. An area surrounded by a dashed line in the wiring plate 11*b*3 is bonded to an end of a corresponding one of the second connection terminals 23*a*, 23*b*, and 23*c*. This area surrounded by the dashed line in the wiring plate 11*b*3 may be connected to an end of a corresponding one of the second connection terminals 23*a*, 23*b*, and 23*c* via an electrically conductive block member.

These wiring plates 11*b*1, 11*b*2, and 11*b*3 are formed on the front surface of the insulating plate 11*a* as follows. First, a metal layer is formed on the front surface of the insulating plate 11*a*. Next, for example, by etching this metal layer, the wiring plates 11*b*1, 11*b*2, and 11*b*3, each of which has a predetermined shape, are obtained. Alternatively, the wiring plates 11*b*1, 11*b*2, and 11*b*3, which have been cut out of a metal layer in advance, may be attached to the front surface of the insulating plate 11*a* by applying pressure. The wiring plates 11*b*1, 11*b*2, and 11*b*3 are only examples. The number, shape, size, or location of the wiring plates 11*b*1, 11*b*2, and 11*b*3 may be suitably determined, as needed.

The metal plate 11*c* is formed on the rear surface of the insulating plate 11*a*. The metal plate 11*c* has a rectangular shape. The area of the metal plate 11*c* is smaller than that of the insulating plate 11*a* and is larger than the area where the wiring plates 11*b*1, 11*b*2, and 11*b*3 are formed in plan view. Corner portions of the metal plate 11*c* may be rounded or chamfered. The metal plate 11*c* is smaller than the insulating plate 11*a* and is formed on the entire area of the insulating plate 11*a*, excepting the periphery of the insulating plate 11*a*. For example, the metal material is copper, aluminum, or an alloy containing at least one of these kinds. The surface of the metal plate 11*c* may be plated to improve its corrosion resistance. The material used for this plating is, for example, nickel, a nickel-phosphorus alloy, or a nickel-boron alloy.

For example, a direct copper bonding (DCB) substrate or an active metal brazed (AMB) substrate may be used as the insulated circuit board 11 having the above construction. The insulated circuit board 11 may be attached to the front surface of the cooling device 3 via a bonding material (not illustrated). The heat generated by the semiconductor chips 12 is transferred to the cooling device 3 via the wiring plates 11*b*1, 11*b*2, and 11*b*3, the insulating plate 11*a*, and the metal plate 11*c*, and is consequently dissipated.

The bonding materials 14*a* and 14*b* are solder. Lead-free solder is used as the solder. The main component of the lead-free solder is, for example, an alloy containing at least two of tin, silver, copper, zinc, antimony, indium, and bismuth. The solder may also contain additive, which is, for example, nickel, germanium, cobalt, or silicon. Since solder containing such additive as described above has improved wettability, luster, and bonding strength, the reliability is improved.

In addition, a brazing material or a thermal interface material may be used as the bonding material (not illustrated) for bonding the individual semiconductor unit 10 and the cooling device 3. For example, the main component of the brazing material is at least one of an aluminum alloy, a titanium alloy, a magnesium alloy, a zirconium alloy, and a silicon alloy. For example, the thermal interface material is an adhesive material, such as an elastomer sheet, room temperature vulcanization (RTV) rubber, gel, or phase change material. By attaching the individual semiconductor unit 10 to the cooling device 3 via the brazing material or the thermal interface material as described above, the heat dissipation of the individual semiconductor unit 10 is improved.

The individual semiconductor chip 12 includes a power device element made of silicon. For example, the individual semiconductor chip 12 has a thickness between 40 μm and 250 μm, inclusive. The linear expansion coefficient of the individual semiconductor chip 12 included in the semiconductor device 1 is less than that of the sealing material and the cooling device 3. The power device element is a reverse-conducting (RC)-insulated gate bipolar transistor (IGBT). The RC-IGBT has the function of an IGBT, which is a switching element, and the function of a free wheeling diode (FWD), which is a diode element. On the front surface of the individual semiconductor chip 12, there are formed control electrodes 12*a* (gate electrodes) and an output electrode (an emitter electrode), which is a main electrode 12*b*. On the rear surface of the individual semiconductor chip 12, there are formed an input electrode (a collector electrode), which is a main electrode. The control electrodes 12*a* are formed along one side of the front surface of the semiconductor chip 12 (or in the center portion along one side). The output electrode is formed in the center portion of the front surface of the semiconductor chip 12.

Alternatively, the semiconductor chip 12 may include a set of a switching element and a diode element, in place of an RC-IGBT. The switching element is, for example, an IGBT or a power MOSFET. In this case, the semiconductor chip 12 includes, for example, an input electrode (a drain electrode or a collector electrode) as a main electrode on its rear surface, and includes control electrodes 12*a* (gate electrodes) and an output electrode (a source electrode or an emitter electrode), which is a main electrode 12*b*, on its front surface. For example, the diode element is an FWD such as a Schottky barrier diode (SBD) or a P-intrinsic-N (PiN) diode. The semiconductor chip 12 as described above includes an output electrode (a cathode electrode) as a main electrode on its rear surface and an input electrode (an anode electrode) as a main electrode on its front surface.

The semiconductor chip 12 may include a switching element formed by a power MOSFET. This semiconductor chip 12 includes a control electrode 12*a* (a gate electrode) and an output electrode (a source electrode) as a main electrode 12*b* on its front surface. The semiconductor chip 12 includes an input electrode (a drain electrode) as a main electrode on its rear surface. This semiconductor chip 12 may be preferably made of silicon carbide.

The lead frames 13*a* and 13*b* electrically connect and wire the semiconductor chips 12 and the wiring plates 11*b*1, 11*b*2, and 11*b*3. The individual semiconductor unit 10 may be a device that constitutes an inverter circuit of a single phase. The lead frame 13*a* directly connects the main electrode 12*b* of the semiconductor chip 12 (on the wiring plate 11*b*2) and the wiring plate 11*b*3. The lead frame 13*b* directly connects the main electrode 12*b* of the semiconductor chip 12 (on the wiring plate 11*b*1) and the wiring plate 11*b*2.

The lead frame 13*a* integrally includes a main electrode bonding portion 13*a*1, a first vertical linkage portion 13*a*2, a horizontal linkage portion 13*a*3, a second vertical linkage portion 13*a*4, and a wiring bonding portion 13*a*5. The lead frame 13*b* integrally includes a main electrode bonding portion 13*b*1, a first vertical linkage portion 13*b*2, a horizontal linkage portion 13*b*3, a second vertical linkage portion 13*b*4, and a wiring bonding portion 13*b*5. The lead frames 13*a* and 13*b* generally have the same thickness and have a planar shape. The lead frames 13*a* and 13*b* may be bent to construct the above portions. The lead frames 13*a* and 13*b* are each made of a metal material having an excellent electrical conductivity. For example, this metal material is copper, aluminum, or an alloy containing at least one of these kinds as its main component. Each of the lead frames 13*a* and 13*b* has a thickness between 0.3 mm and 2.0 mm, inclusive. The surface of each of the lead frames 13*a* and 13*b* may be plated to improve its corrosion resistance. The material used for this plating is, for example, nickel, a nickel-phosphorus alloy, or a nickel-boron alloy.

The main electrode bonding portions 13*a*1 and 13*b*1 each have a planar shape. The main electrode bonding portions 13*a*1 and 13*b*1 are bonded to the main electrodes 12*b* of their respective semiconductor chips 12 (on the wiring plates 11*b*2 and 11*b*1) via the bonding material 14*b*. The main electrode bonding portion 13*a*1 and 13*b*1 each have a rectangular shape in plan view, as with the main electrodes 12*b*.

The first vertical linkage portion 13*a*2 has its lower end that is integrally connected to an end of the main electrode bonding portion 13*a*1. The first vertical linkage portion 13*b*2 has its lower end that is integrally connected to an end of the main electrode bonding portion 13*b*1. The first vertical linkage portions 13*a*2 and 13*b*2 have their respective upper ends that are located vertically above (in the +Z direction) the ends of the main electrode bonding portions 13*a*1 and 13*b*1. The first vertical linkage portion 13*a*2 is bonded to the end of the main electrode bonding portion 13*a*1 bonded to the corresponding semiconductor chip 12, the end being located in the direction of the wiring plate 11*b*3 (in the −Y direction). The first vertical linkage portion 13*b*2 is bonded to the end of the main electrode bonding portion 13*b*1 bonded to its corresponding semiconductor chip 12, the end being located in the direction of the wiring plate 11*b*2 (in the −X direction) and in the −Y direction.

The horizontal linkage portion 13*a*3 is integrally connected to the upper end of the first vertical linkage portion 13*a*2 and extends to a location above the wiring plate 11*b*3. Similarly, the horizontal linkage portion 13*b*3 is integrally connected to the upper end of the first vertical linkage portion 13*b*2 and extends to a location above the wiring plate 11*b*2. The horizontal linkage portion 13*a*3 extends over the gap between the wiring plates 11*b*2 and 11*b*3, and the horizontal linkage portion 13*b*3 extends over the gap between the wiring plates 11*b*1 and 11*b*2. The horizontal linkage portions 13*a*3 and 13*b*3 extend in parallel to the insulated circuit board 11. The horizontal linkage portions 13*a*3 and 13*b*3 may extend at the same height. The heights of the first vertical linkage portions 13*a*2 and 13*b*2 and the second vertical linkage portions 13*a*4 and 13*b*4 are suitably set such that the horizontal linkage portions 13*a*3 and 13*b*3 are formed as described above.

The second vertical linkage portion 13*a*4 has its upper end that is integrally connected to an end of the horizontal linkage portion 13*a*3 and has its lower end that is located vertically below its upper end (in the −Z direction (first direction)). The lower end is integrally connected to the wiring bonding portion 13*a*5. Similarly, the second vertical linkage portion 13*b*4 has its upper end that is integrally connected to an end of the horizontal linkage portion 13*b*3 and has its lower end that is located vertically below its upper end (in the −Z direction). The lower end is integrally connected to the wiring bonding portion 13*b*5.

The wiring bonding portions 13*a*5 and 13*b*5 are bonded to the wiring plates 11*b*3 and 11*b*2, respectively, and are integrally connected to the lower ends of the second vertical linkage portions 13*a*4 and 13*b*4, respectively. The wiring bonding portions 13*a*5 and 13*b*5 may be bonded to the wiring plates 11*b*3 and 11*b*2, respectively, by the above-described bonding material or ultrasonic bonding.

The first vertical linkage portion 13*a*2, the horizontal linkage portion 13*a*3, the second vertical linkage portion 13*a*4, and the wiring bonding portion 13*a*5 of the lead frame 13*a* have the same width. This width is the length in the directions (the ±X directions) perpendicular to the wiring directions (the ±Y directions) of the lead frame 13*a*. The first vertical linkage portion 13*b*2, the horizontal linkage portion 13*b*3, and the second vertical linkage portion 13*b*4 of the lead frame 13*b* have the same width. This width is the length in the directions (the ±Y directions) perpendicular to the wiring directions (the ±X directions) of the lead frame 13*b*.

In addition, the control electrodes 12*a* of the semiconductor chips 12 of the semiconductor units 10*a*, 10*b*, and 10*c* stored in the unit storage portions 21*e*, 21*f*, and 21*g* of the case 20 are mechanically and electrically connected to the other ends of the control terminals 25*a*, 25*b*, and 25*c* by wires 26. The main component of each of these wires 26 is a material having an excellent electrical conductivity. The material is, for example, gold, copper, aluminum, or an alloy containing at least one of these kinds. Preferably, the main component of the individual wire 26 may be an aluminum alloy containing a minute amount of silicon. For example, the individual wire 26 has a diameter between 100 μm and 400 μm, inclusive.

Figure 6:
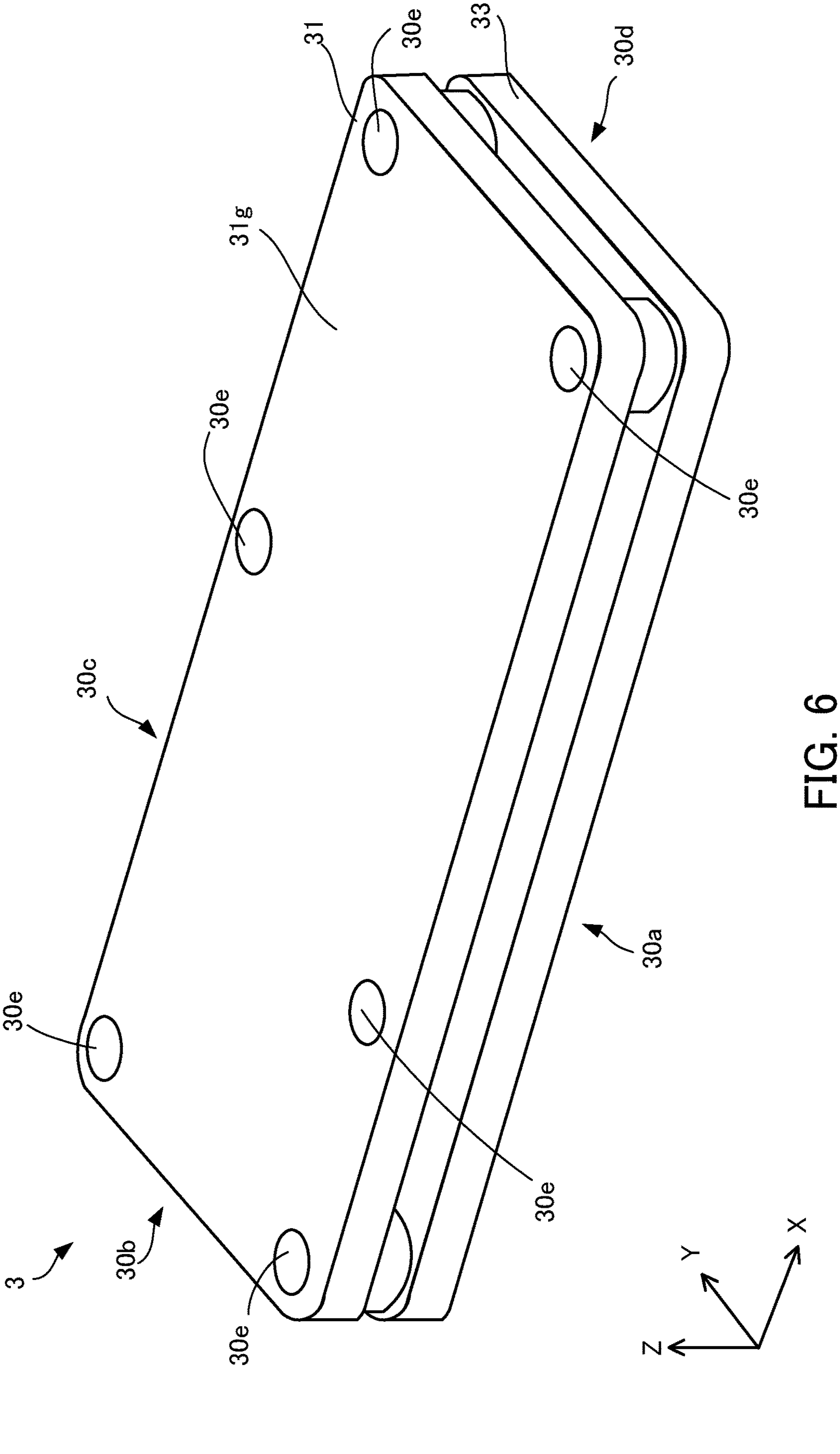
FIG. 6 is a first perspective view of a cooling device included in the semiconductor device according to the first embodiment.
Figure 7:
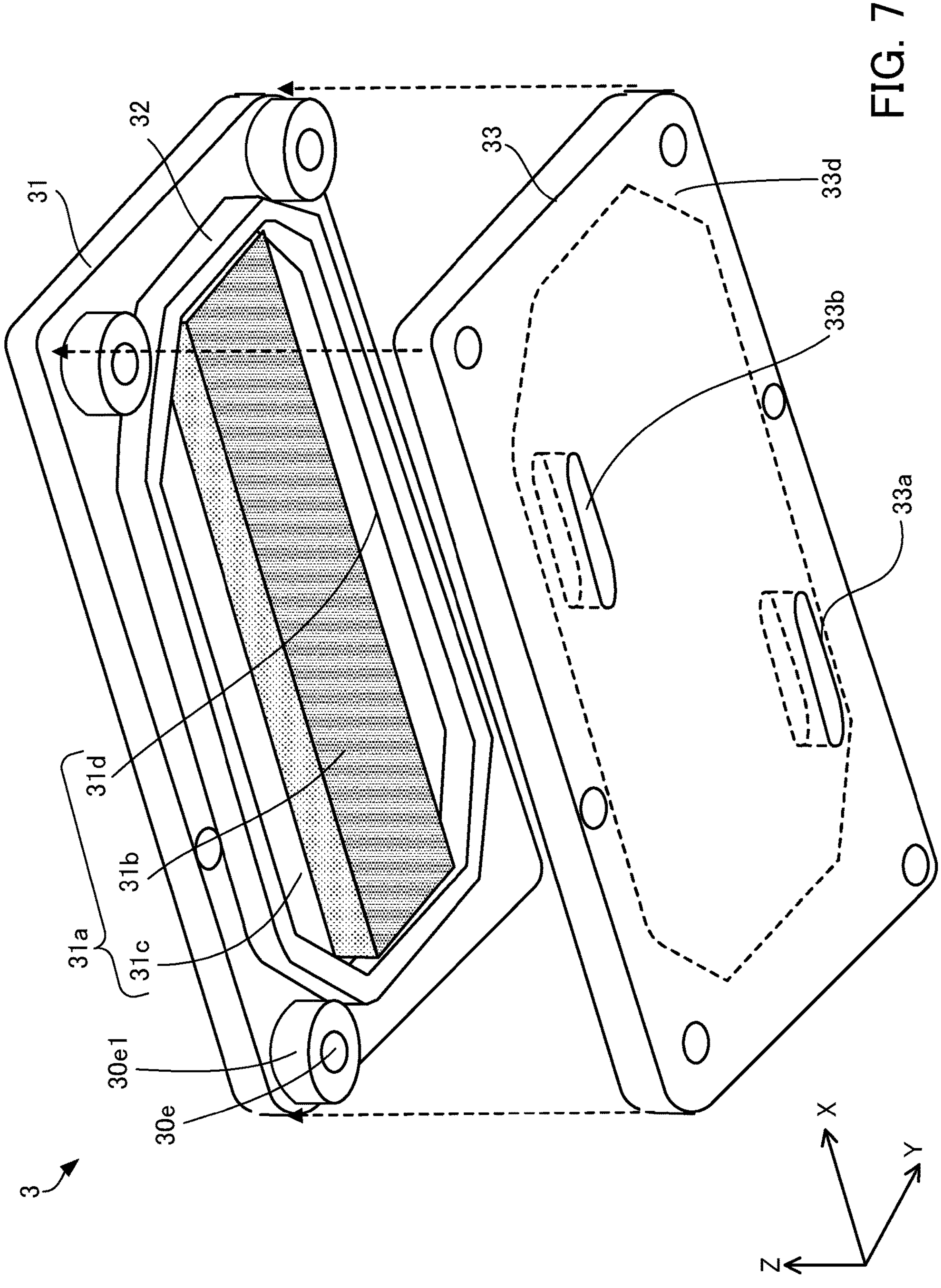
FIG. 7 is a second perspective view of the cooling device included in the semiconductor device according to the first embodiment.
Figure 8:
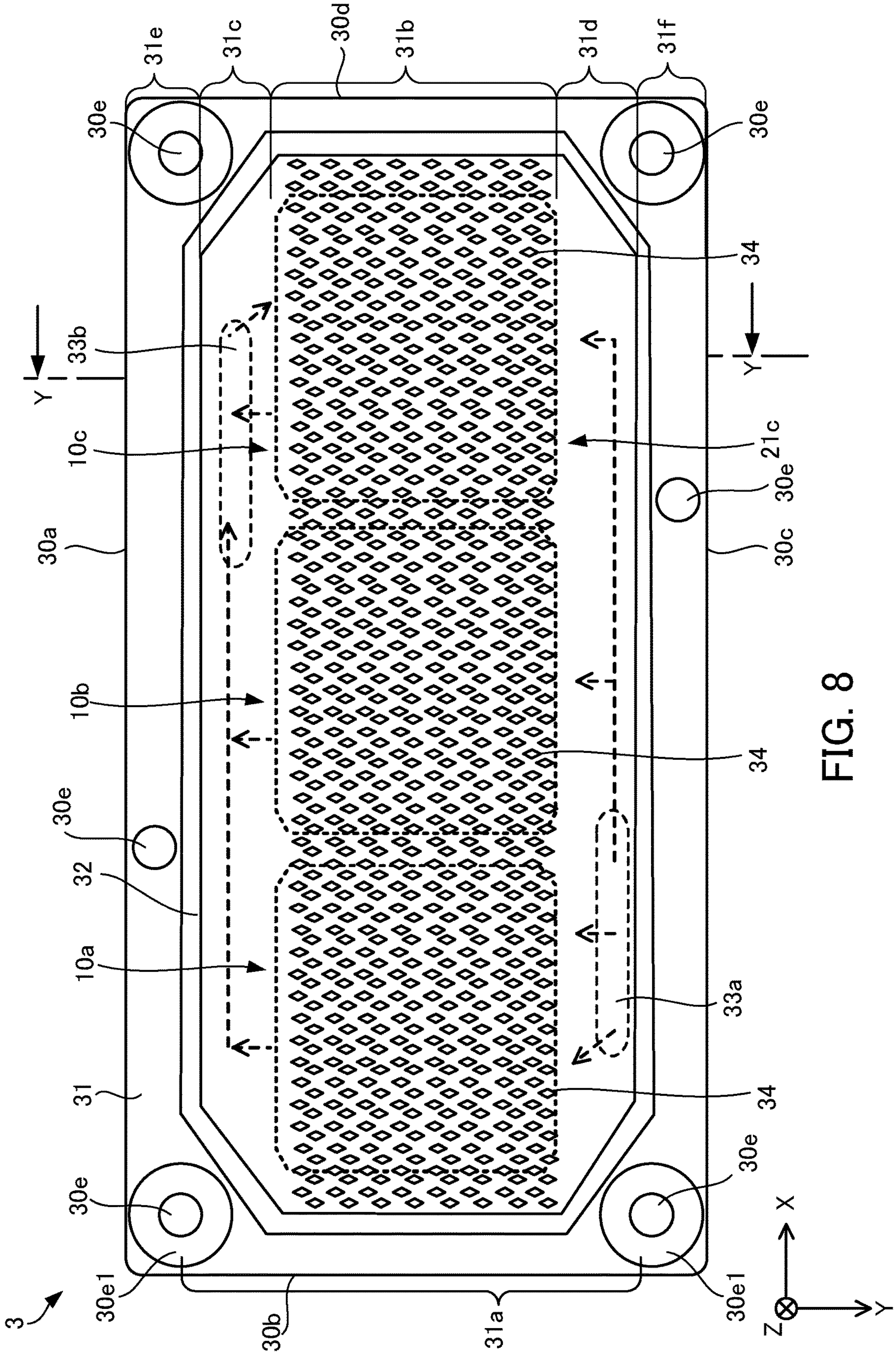
FIG. 8 is a rear view of a top plate of the cooling device included in the semiconductor device according to the first embodiment.

Next, the cooling device 3 will be described with reference to FIGS. 6 to 8. FIGS. 6 and 7 are perspective views of the cooling device included in the semiconductor device according to the first embodiment. FIG. 8 is a rear view of the top plate of the cooling device included in the semiconductor device according to the first embodiment. FIG. 7 is a perspective view of the rear surface of the top plate 31 of the cooling device 3. FIG. 8 is a plan view of the rear surface of the top plate 31 of the cooling device 3.

The cooling device 3 includes the inlet 33*a* through which refrigerant flows into the cooling device 3 and the outlet 33*b* through which the refrigerant that has flowed inside the cooling device 3 is discharged to the outside. The semiconductor unit 10 is cooled by causing the cooling device 3 to release the heat generated by the semiconductor unit 10 to the outside via the refrigerant. For example, water, antifreeze solution (ethylene glycol solution), or long life coolant (LLC) is used as the refrigerant.

This cooling device 3 has a rectangular shape including long sides 30*a* and 30*c* and short sides 30*b* and 30*d* in plan view. In addition, the cooling device 3 has through-holes 30*e* at least in its four corners in plan view.

The three semiconductor units 10*a*, 10*b*, and 10*c* are mounted along the long sides 30*a* and 30*c* (along the X direction) at the center portion of the front surface of the cooling device 3. In FIG. 8, the areas where the semiconductor units 10*a*, 10*b*, and 10*c* are disposed are indicated by dashed lines. The number of semiconductor units 10 is not limited to 3. As long as the semiconductor units 10 are disposed at the center portion (a cooling area 31*b* described below) of the cooling device 3, the arrangement and size of the semiconductor units 10 are not limited to those described in the present embodiment. In addition, the cooling device 3 may include a pump and a heat dissipation device (a radiator). The pump circulates the refrigerant by flowing the refrigerant into the cooling device 3 through the inlet 33*a* and flowing the refrigerant that has been discharged from the outlet 33*b* into the cooling device 3 through the inlet 33*a* again. The heat dissipation device releases the heat of the refrigerant, the heat having been transferred from the semiconductor units 10, to the outside.

This cooling device 3 includes the top plate 31, a circularly connected side wall 32 on the rear surface of the top plate 31, and a cooling bottom plate 33 facing the top plate 31 and connected to the rear surface of the side wall 32. The top plate 31 has a rectangular shape including four sides constituting the long sides 30*a* and 30*c* and the short sides 30*b* and 30*d* in plan view, and the through-holes 30*e* are formed in its four corners. The corner portions of the top plate 31 may be rounded in plan view.

In addition, the top plate 31 is divided into a flow path area 31*a* and outer edge areas 31*e* and 31*f*, as illustrated in FIG. 8. As will be described below, the side wall 32 is connected to the rear surface of the top plate 31. The flow path area 31*a* is surrounded by the side wall 32. The flow path area 31*a* is further divided into a cooling area 31*b* and communication areas 31*c* and 31*d* extending in parallel to the long sides 30*a* and 30*c*. The cooling area 31*b* is a center rectangular area extending in parallel to the long sides 30*a* and 30*c* (the longitudinal direction) of the top plate 31. The plurality of semiconductor units 10 are aligned in the X direction in the cooling area 31*b* of a cooling surface (cooling top surface) 31*g*, which is the front surface of the top plate 31. The cooling surface 31*g*, on which the semiconductor units are mounted, of the top plate 31 is formed as a flat surface without difference in level in the thickness direction (the Z direction). That is, the cooling surface 31*g* lies in the same plane.

Figure 9:
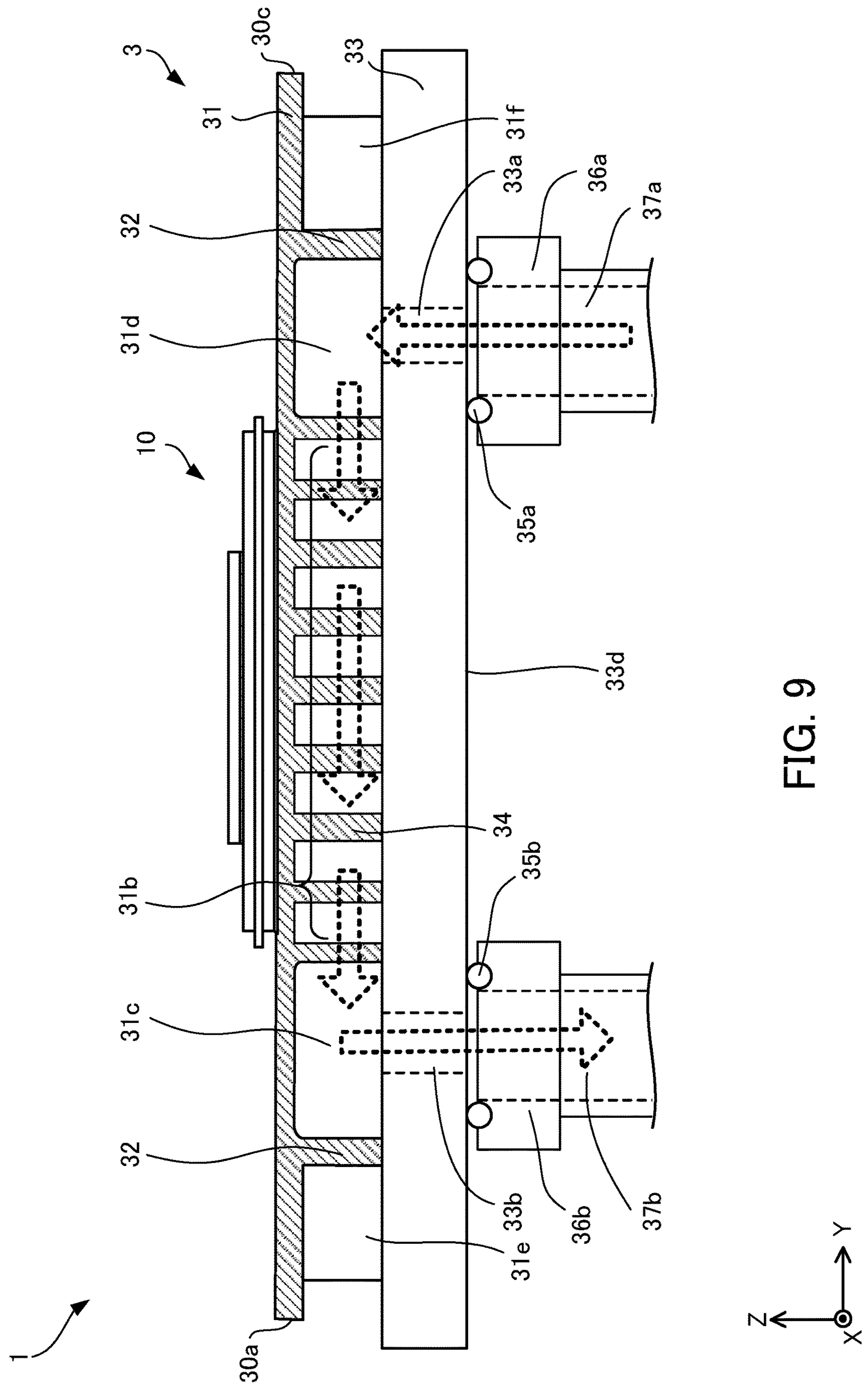
FIG. 9 illustrates the flow of refrigerant in the cooling device included in the semiconductor device according to the first embodiment.

A plurality of heat dissipation fins 34 are formed in the cooling area 31*b* on the rear surface of the top plate 31. The top plate 31 has a thickness (the length in the Z direction), for example, between 0.5 mm and 5.0 mm, inclusive. The plurality of heat dissipation fins 34 extend between the cooling area 31*b* on the rear surface of the top plate 31 and the cooling bottom plate 33 and connect the cooling area 31*b* and the cooling bottom plate 33. The height of the plurality of heat dissipation fins 34 (the length in the Z direction) matches the gap between the top plate 31 and the cooling bottom plate 33, and is between 1.5 mm and 15.0 mm, inclusive, preferably, between 2.0 mm and 12.0 mm, inclusive. FIG. 8 is a plan view of the heat dissipation fins 34, and FIG. 9 is a side view of the heat dissipation fins 34. However, in FIG. 8, the heat dissipation fins 34 are illustrated only schematically, and the actual heat dissipation fins 34 may differ from those illustrated in FIG. 8. The number of heat dissipation fins 34 disposed along the long sides 30*a* and 30*c* in the cooling area 31*b* is greater than the number of heat dissipation fins 34 disposed along the short sides 30*b* and 30*d*. The cooling area 31*b* includes the areas of the heat dissipation fins 34 and the areas of the flow paths among the heat dissipation fins 34. The distance between two neighboring heat dissipation fins 34 may be shorter than the width of the individual heat dissipation fin 34. The individual heat dissipation fin 34 has an upper end and a lower end in the ±Z directions. The upper end of the individual heat dissipation fin 34 is thermally and mechanically connected to the rear surface of the top plate 31. The lower end of the individual heat dissipation fin 34 is thermally and mechanically connected to the front surface (the inner side of the cooling device 3) of the cooling bottom plate 33. The upper end of the individual heat dissipation fin 34 may be formed integrally with the top plate 31. That is, the heat dissipation fins 34 may integrally protrude in the −Z direction from the rear surface of the top plate 31. On the other hand, the lower end of the individual heat dissipation fins 34 may be firmly attached to the front surface (the inner side of the cooling device 3) of the cooling bottom plate 33 by brazing or the like. The extension direction of the heat dissipation fins 34, which is the Z direction, is approximately perpendicular to the main surfaces of the top plate 31 and the cooling bottom plate 33. Each of the heat dissipation fins 34 may be a pin fin. In addition, each of the plurality of heat dissipation fins 34 has a rectangular cross section parallel to a main surface of the top plate 31. In FIG. 8, the heat dissipation fins 34 each have a rhombic cross section. In this way, as compared with heat dissipation fins 34 having a circular cross section parallel to the main surface of the top plate 31, the heat dissipation fins 34 each have a larger surface area that comes in contact with the refrigerant, and consequently have a better heat dissipation efficiency. The dimensions of the top plate 31 and the heat dissipation fins 34 may be set suitably based on the cooling performance, etc., needed.

In addition, the plurality of heat dissipation fins 34 may be disposed in the cooling area 31*b* of the cooling surface 31*g* of the top plate 31 such that, when the refrigerant flows into the cooling area 31*b*, any of the sides of the rectangular heat dissipation fins 34 are not perpendicular to the main flow direction of the refrigerant in the cooling area 31*b*. In the present embodiment, the main flow direction of the refrigerant in the cooling area 31*b* is the Y direction (parallel to the short sides 30*b* and 30*d*). The plurality of heat dissipation fins 34 are disposed in the cooling area 31*b* such that any of the sides of the rectangular heat dissipation fins 34 is not perpendicular to the Y direction. More specifically, the plurality of heat dissipation fins 34 are disposed such that any of the sides of the rectangular heat dissipation fins 34 is not perpendicular to the Y direction, such that one diagonal line of the individual rectangular cross section is parallel to the X direction (the long sides 30*a* and 30*c*), and such that the other diagonal line is parallel to the Y direction. Alternatively, the plurality of heat dissipation fins 34 may be disposed such that any of the sides of the rectangular heat dissipation fins 34 is not perpendicular to the Y direction, such that one diagonal line of the individual rectangular cross section makes an oblique angle with the X direction, and such that the other diagonal line makes an oblique angle with the Y direction. As compared with a case in which any of the sides of the rectangular heat dissipation fins 34 is disposed to be perpendicular to the above flow direction in the cooling area 31*b*, any one of the above-described constructions achieves less loss of the flow velocity of the refrigerant flowing in the cooling area 31*b*, and achieves a better heat dissipation efficiency.

In addition, in the X-Y sectional view illustrated in FIG. 8, the individual heat dissipation fin 34 has a rhombic shape shorter horizontally than vertically. Each of the plurality of heat dissipation fins 34 may have a polygonal cross section, e.g., a square cross section. Alternatively, each of the plurality of heat dissipation fins 34 may have a circular cross section, e.g., a truly circular cross section. The plurality of heat dissipation fins 34 may be arranged to form a predetermined pattern in the cooling area 31*b*. As illustrated in FIG. 8, the plurality of heat dissipation fins 34 are disposed in a staggered arrangement. The plurality of heat dissipation fins 34 may be arranged in a square in the cooling area 31*b*. Although pin fins are used as the heat dissipation fins 34 in the present embodiment, straight fins may alternatively be used, for example.

The communication areas 31*c* and 31*d* are adjacent to two sides of the cooling area 31*b* on the cooling surface 31*g* of the top plate 31 and extend along the cooling area 31*b*. That is, the communication area 31*c* extends from the cooling area 31*b* to the side wall 32 (in the direction of the long side 30*a*), and the communication area 31*d* extends from the cooling area 31*b* to the side wall 32 (in the direction of the long side 30*c*). In FIG. 8, the communication areas 31*c* and 31*d* each have a trapezoidal shape. Depending on the region surrounded by the side wall 32, the communication areas 31*c* and 31*d* may each have a rectangular shape, a semicircular shape, or a curved shape having a plurality of peaks, for example. In addition, corner portions of the communication areas 31*c* and 31*d* may be rounded with a curvature in plan view. In this case, connection portions of the side wall 32 constituting the communication areas 31*c* and 31*d* are rounded. Consequently, the refrigerant flowing in the communication areas 31*c* and 31*d* easily flows without remaining around the smooth corner portions. As a result, these corner portions are protected from corrosion. Although the communication areas 31*c* and 31*d* are symmetrically shaped in the present embodiment, the communication areas 31*c* and 31*d* may be shaped differently. While described in detail below, the outlet 33*b* and the inlet 33*a* are formed in the communication areas 31*c* and 31*d* and near the short sides 30*d* and 30*b*, respectively. In addition, the outlet 33*b* and the inlet 33*a* are formed in the center portion of the communication areas 31*c* and 31*d* in the Y direction. The communication areas 31*c* and 31*d* may be shaped such that the refrigerant easily flows through the inlet 33*a* and the outlet 33*b*. For example, the communication area 31*c* may have a tapered shape as it extends to the outlet 33*b* such that the refrigerant is poured into the outlet 33*b*.

The outer edge areas 31*e* and 31*f* are located outside the flow path area 31*a* (the cooling area 31*b* and the communication areas 31*c* and 31*d*) of the top plate 31. That is, the outer edge areas 31*e* and 31*f* extend from the side wall 32 of the top plate 31 to the outer periphery of the top plate 31 in plan view. The above-described through-holes 30*e* and reinforced portions 30*e*1 are formed in the outer edge areas 31*e* and 31*f*.

The side wall 32 has a continuously circular shape surrounding the cooling area 31*b* and the communication areas 31*c* and 31*d* on the rear surface of the top plate 31. The +Z direction upper end of the side wall 32 is firmly attached to the rear surface of the top plate 31. In addition, the −Z direction lower end of the side wall 32 is firmly attached to the front surface of the cooling bottom plate 33. In FIG. 8, the side wall 32 has eight sides including the sides parallel to the short sides 30*b* and 30*d* along the cooling area 31*b*, the sides parallel to the long sides 30*a* and 30*c* along the communication areas 31*c* and 31*d*, and the sides, each of which connects one of the former sides and one of the latter sides. The inner corner portions of the circular side wall 32, each of the corner portions being formed where two sides are connected to each other, may be rounded. As long as the side wall 32 includes the cooling area 31*b* rectangular in plan view and includes the communication areas 31*c* and 31*d* on two sides of the cooling area 31*b*, the side wall 32 may have a different number of sides. In addition, the height of the side wall 32 (the length in the Z direction) matches the height of the plurality of heat dissipation fins 34, and is, for example, between 1.5 mm and 15.0 mm, inclusive, preferably, between 2.0 mm and 12.0 mm, inclusive. In addition, the thickness of the side wall 32 (the length in the Y direction) is suitably set such that the side wall 32 is sandwiched by the top plate 31 and the cooling bottom plate 33 as will be described below, such that the strength of the cooling device 3 is maintained, and such that the cooling performance is not deteriorated. For example, the thickness is between 1.0 mm and 3.0 mm, inclusive. The dimensions of the side wall 32 are suitably set based on the cooling performance, etc., needed.

In addition, the reinforced portions 30*e*1 may be formed around the through-holes 30*e* on the rear surface (the inner side of the cooling device 3) of the top plate 31. The reinforced portions 30*e*1 extend to correspond to the through-holes 30*e* and function as screw frames. The side wall 32 is sandwiched by the top plate 31 and the cooling bottom plate 33 and maintains the strength of the cooling device 3. For this reason, the height of the reinforced portions 30*e*1 is approximately the same as the height of the side wall 32.

The cooling bottom plate 33 has a planar shape and has the same shape as that of the top plate 31 in plan view. That is, the cooling bottom plate 33 has a rectangular shape having four sizes that constitute its long sides and short sides in plan view, and has fastening holes that match the top plate 31 at its four corners. The cooling bottom plate 33 may also have rounded corner portions. In addition, the front surface and the bottom surface 33*d* of the cooling bottom plate 33 are parallel to each other. The front surface and the bottom surface 33*d* of the cooling bottom plate 33 may be portions that face the area where the semiconductor units 10*a*, 10*b*, and 10*c* are mounted. In the present embodiment, the bottom surface 33*d* of the cooling bottom plate 33 is formed as a flat surface without difference in level and lies in the same plane. In addition, the bottom surface 33*d* of the cooling bottom plate 33 and the cooling surface 31*g* of the top plate 31 may also be parallel to each other. The inlet 33*a* into which the refrigerant flows and the outlet 33*b* from which the refrigerant is discharged are formed in the bottom surface 33*d* of the cooling bottom plate 33. A sealing area is set around each of the inlet 33*a* and the outlet 33*b* in the bottom surface 33*d* of the cooling bottom plate 33. The inlet 33*a* is formed in the communication area 31*d* near the long side 30*c* and the short side 30*b*. The outlet 33*b* is formed in the communication area 31*c* near the long side 30*a* and the short side 30*d*. That is, the inlet 33*a* and the outlet 33*b* are formed symmetrically with respect to the center point of the bottom surface 33*d* of the cooling bottom plate 33. When this cooling bottom plate 33 is connected to the side wall 32, the reinforced portions 30*e*1 are each connected to the periphery of a corresponding one of the fastening holes in the cooling bottom plate 33. The cooling bottom plate 33 has a thickness that is able to maintain the overall strength of the cooling device 3 and that does not deteriorate the cooling performance. In addition, the cooling bottom plate 33 has a strength such that distribution pipes are suitably attached to the inlet 33*a* and the outlet 33*b* as will be described below. Thus, the thickness of the cooling bottom plate 33 is between 1.0 time and 5.0 times, inclusive, the thickness of the top plate 31. More preferably, the thickness of the cooling bottom plate 33 is between 2.0 times and 3.0 times, inclusive, the thickness of the top plate 31. The thickness of the cooling bottom plate 33 is preferably, for example, between 2.0 mm and 10.0 mm, inclusive. The dimensions of the cooling bottom plate 33 may be set suitably based on the cooling performance, etc., needed.

The flow path area 31*a* surrounded by the top plate 31, the side wall 32, and the cooling bottom plate 33 is formed inside the cooling device 3 constructed as described above. The flow path area 31*a* is further divided into the cooling area 31*b* and the communication areas 31*c* and 31*d*. The plurality of heat dissipation fins 34 connecting the top plate 31 and the cooling bottom plate 33 extend in the cooling area 31*b*. The communication areas 31*c* and 31*d* are formed by the top plate 31, the side wall 32, and the cooling bottom plate 33. The communication area 31*d* is connected to the cooling area 31*b*. The refrigerant that has flowed through the inlet 33*a* flows to the cooling area 31*b* from the communication area 31*d*. The communication area 31*c* is connected to the cooling area 31*b*. The refrigerant that has flowed through the cooling area 31*b* flows to the communication area 31*c* and is discharged from the outlet 33*b*. The flow of the refrigerant in the cooling device 3 will be described below. In addition, the outer edge areas 31*e* and 31*f* are formed by the top plate 31, the outside of the side wall 32, and the cooling bottom plate 33.

The cooling device 3 is made of a material containing a metal material having an excellent electrical conductivity as its main component. For example, this metal material is copper, aluminum, or an alloy containing at least one of these kinds. The cooling device 3 may be plated to improve its corrosion resistance. The material used for this plating is, for example, nickel, a nickel-phosphorus alloy, or a nickel-boron alloy. In addition, the top plate 31 on which the plurality of heat dissipation fins 34 are formed is formed by forging or casting (die-casting), for example. If the top plate 31 is formed by forging, pressure is applied to a member made of a material containing the metal material in the shape of a block as its main component by using a mold such that the member is plastically deformed. In this way, the top plate 31 on which the plurality of heat dissipation fins 34 and the side wall 32 are formed is consequently obtained. If the top plate 31 is formed by die-casting, melted die-cast material is first flowed into a predetermined mold and is next cooled. Finally, the resultant material is removed from the mold. In this way, the top plate 31 on which the plurality of heat dissipation fins 34 and the side wall 32 are formed is consequently obtained. The die-cast material in this case is, for example, an aluminum alloy. The top plate 31 on which the plurality of heat dissipation fins 34 and the side wall 32 are formed may be formed by cutting a member made of a material containing the metal material in the shape of a block as its main component.

The cooling bottom plate 33 is bonded to the plurality of heat dissipation fins 34 and the side wall 32 of the top plate 31. This bonding is made by brazing. Thus, the rear surface, or an end portion, of the side wall 32 and an end portion of the individual heat dissipation fins 34 extending from a main surface (the rear surface) of the top plate 31 are each bonded to the front surface of the cooling bottom plate 33 via a brazing material. The cooling device 3 as described above is referred to as a so-called closed structure. When the top plate 31 is formed by casting, a material having a melting point lower than that of a die-cast material is used as the brazing material used for the brazing. This brazing material is an alloy containing aluminum as its main component, for example.

The reinforced portions 30*e*1 may also be formed on the top plate 31 and may be bonded to the cooling bottom plate 33 by brazing. The present embodiment assumes that the plurality of heat dissipation fins 34 are connected to the top plate 31. Alternatively, the plurality of heat dissipation fins 34 may be formed in an area of the cooling bottom plate 33, the area matching the cooling area 31*b*. In this way, the cooling device 3 is obtained.

Next, the flow of the refrigerant in the cooling device 3 will be described with reference to FIG. 9 (and FIG. 8). FIG. 9 illustrates the flow of the refrigerant in the cooling device included in the semiconductor device according to the first embodiment. FIG. 9 is a sectional view taken along a dashed-dotted line Y-Y in FIG. 8. FIG. 9 illustrates only the cooling device 3 on which a semiconductor unit 10 is disposed, and the illustration of the case 20 is omitted.

As described above, the refrigerant is circulated by a pump inside the cooling device 3. To circulate the refrigerant, a distribution head 36*a* is attached to the sealing area surrounding the inlet 33*a* via a ring rubber seal 35*a*. A distribution pipe 37*a* is attached to the distribution head 36*a*. In addition, a distribution head 36*b* is attached to the sealing area surrounding the outlet 33*b* via a ring rubber seal 35*b*. A distribution pipe 37*b* is attached to the distribution head 36*b*. The pump is connected to the distribution pipes 37*a* and 37*b*. The individual sealing area may cover an area from the outer edge of the corresponding one of the inlet 33*a* and the outlet 33*b* to a circumference away from the outer edge by the distance between 0.2 times and 2.0 times the width of the corresponding inlet 33*a* or outlet 33*b* in plan view. The width of each of the inlet 33*a* and the outlet 33*b* may be the length of the shortest path running through the gravity center of the corresponding inlet 33*a* or outlet 33*b*. For example, when the inlet 33*a* and the outlet 33*b* each have a rectangular shape or an elongated hole shape, the width of the inlet 33*a* and the outlet 33*b* may be the distance between long sides. When the inlet 33*a* and the outlet 33*b* each have an oval shape, the width of the inlet 33*a* and the outlet 33*b* may be the minor axis of the oval shape. When the inlet 33*a* and the outlet 33*b* each have a circular shape, the width of the inlet 33*a* and the outlet 33*b* may be the diameter of the circular shape. The individual sealing area may cover, in plan view, an area from the outer edge of a corresponding one of the inlet 33*a* and the outlet 33*b* to a circumference away from the outer edge by 20 mm, preferably, by 10 mm.

As illustrated in FIG. 8, the refrigerant that has flowed from the inlet 33*a* flows to the communication area 31*d* and spreads in the communication area 31*d*. The refrigerant that has flowed to the communication area 31*d* spreads to the short sides 30*b* and 30*d* (in the X direction) and also spreads to the long side 30*a* (in the −Y direction). When the refrigerant flows from the inlet 33*a*, the refrigerant directly spreads to the long side 30*a* (in the −Y direction). In this way, the refrigerant flows to the entire side facing the long side 30*c* of the cooling area 31*b*.

As illustrated in FIG. 9, the refrigerant that has flowed to the side (near the long side 30*c*) of the cooling area 31*b* flows toward the long side 30*a* (in the −Y direction) through the plurality of heat dissipation fins 34. The heat from the heated semiconductor units 10 is transferred to the plurality of heat dissipation fins 34 via the top plate 31. When flowing through the plurality of heat dissipation fins 34, the refrigerant receives the heat from the plurality of heat dissipation fins 34. Thus, the heat from the semiconductor units 10 is easily transferred to the plurality of heat dissipation fins 34. In this way, more heat is transferred to the refrigerant flowing through the heat dissipation fins 34, and a better cooling performance is achieved.

As illustrated in FIG. 8 (and FIG. 9), the refrigerant that has received the heat flows to the communication area 31*c* from the side of the cooling area 31*b*, the side facing the long side 30*a*, and is discharged from the outlet 33*b* to the outside. That is, the refrigerant including the heat transferred from the plurality of heat dissipation fins 34 is discharged. The discharged refrigerant is cooled by the heat dissipation device, and the cooled refrigerant flows into the cooling device 3 through the inlet 33*a* by the pump again. The semiconductor unit 10 is cooled by circulating the refrigerant inside the cooling device 3 and releasing the heat generated by the semiconductor units 10 to the outside.

Figure 10:
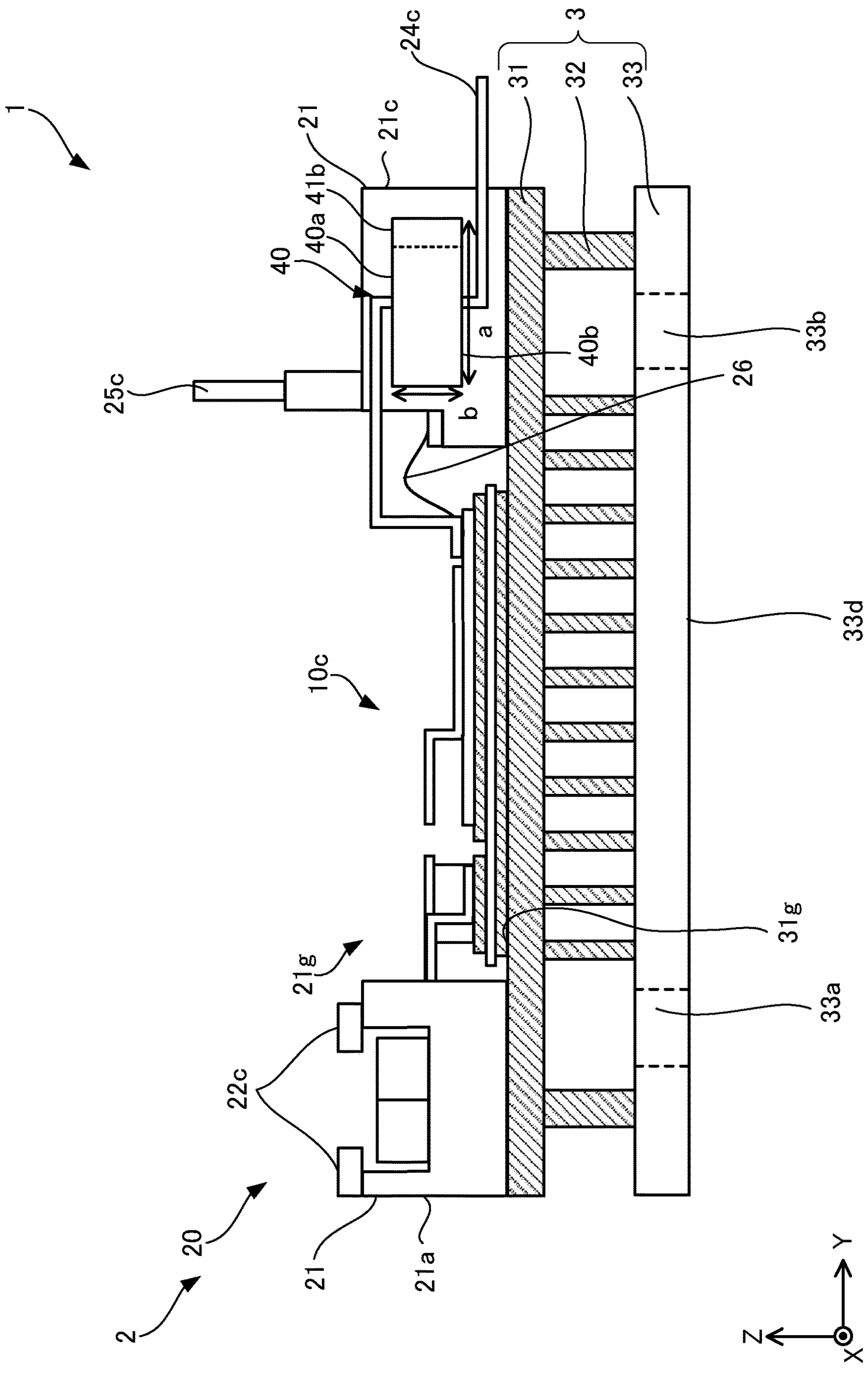
FIG. 10 is a sectional view of the semiconductor device according to the first embodiment.
Figure 11:
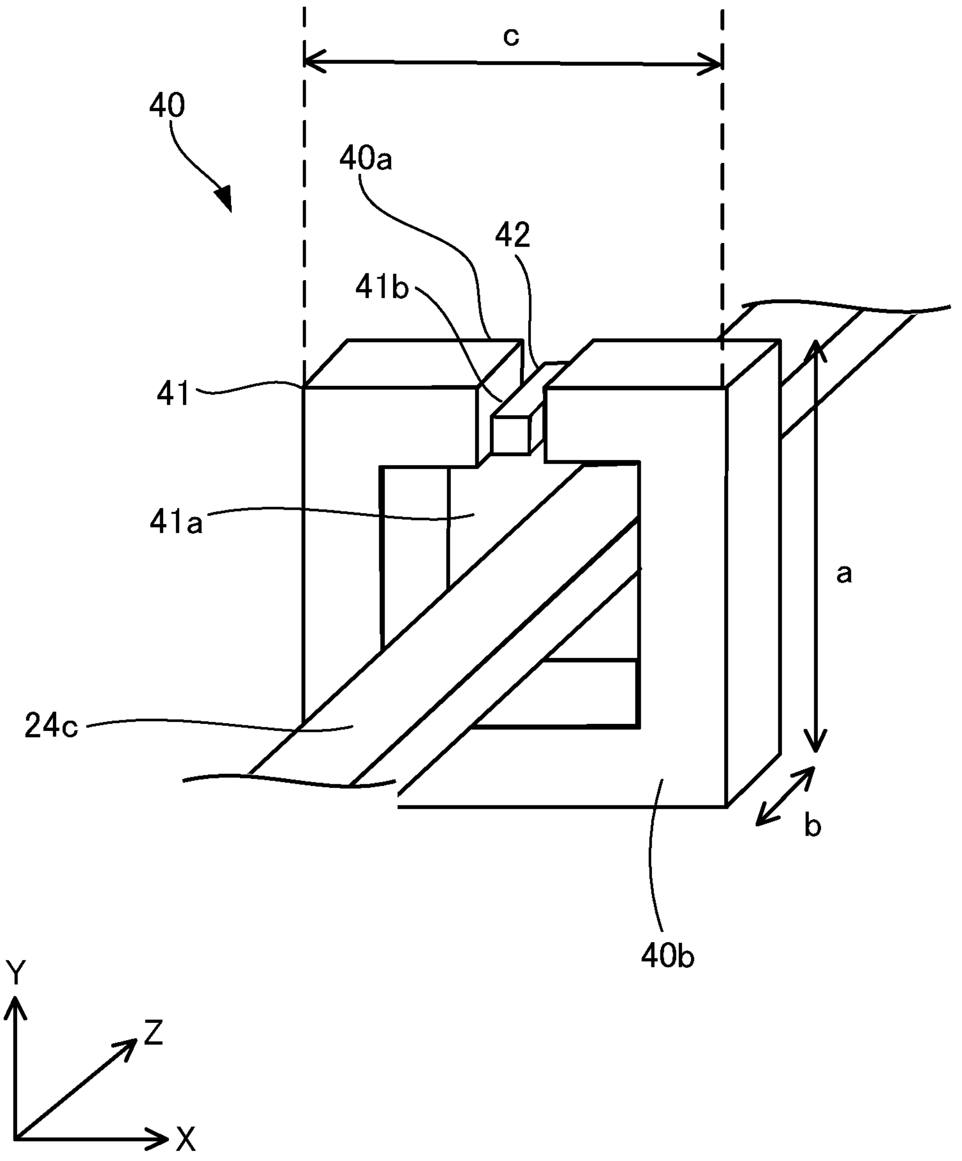
FIG. 11 illustrates a current sensor included in the semiconductor device according to the first embodiment.

Next, the current sensors 40 included in the semiconductor module 2 will be described with reference to FIGS. 10 and 11. FIG. 10 is a sectional view of the semiconductor device according to the first embodiment. FIG. 11 illustrates a current sensor included in the semiconductor device according to the first embodiment. FIG. 10 is a sectional view taken along a dashed-dotted line X-X in FIG. 1. FIG. 11 schematically illustrates a current sensor 40 included in the case 20.

The individual current sensor 40 includes a magnetic core 41 and a Hall element 42. The magnetic core 41 is formed in the shape of the letter "C" in plan view. The magnetic core 41 is formed in a rectangular parallelepiped shape having a gap as a measurement opening 41*b* and having a terminal opening (penetration area) 41*a* in the center of the magnetic core 41. That is, the magnetic core 41 extends along a periphery of the terminal opening and has the gap (measurement opening) in a direction in which the magnetic core 41 extends. The terminal opening 41*a* extends from a top surface 40*a* of the magnetic core 41 to a bottom surface 40*b* of the magnetic core 41.

The magnetic core 41 is made of a material containing a magnetic material as its main component. The magnetic material is, for example, ferrite. The magnetic core 41 includes the terminal opening 41*a* and the measurement opening 41*b*. The magnetic core 41 includes the top surface 40*a* and the bottom surface 40*b* opposite thereto, which are formed in the shape of the letter "C" in plan view.

The terminal opening 41*a* is located in the center of the top surface 40*a* and the bottom surface 40*b* and penetrates the magnetic core 41 from the top surface 40*a* to the bottom surface 40*b* (the penetration direction) in parallel to a height b of the magnetic core 41. That is, the terminal opening 41*a* is a penetration portion that penetrates the magnetic core 41 in the vertical direction (first direction) with respect to the top plate 31. An intermediate portion of each of the U-phase output terminal 24*a*, the V-phase output terminal 24*b*, and the W-phase output terminal 24*c* passes through a corresponding one of the terminal openings 41*a* in parallel to the penetration direction. FIGS. 10 and 11 illustrate a terminal opening 41*a* through which the W-phase output terminal 24*c* passes.

These magnetic cores 41 described above may each have a rectangular shape or a circular shape in plan view, as long as the magnetic cores 41 are each formed in the shape of the letter "C" in plan view. In the present embodiment, as an example, the individual magnetic core 41 has a rectangular shape. The individual terminal opening 41*a* may also have a rectangular shape or a circular shape in plan view. In the present embodiment, as an example, the individual terminal opening 41*a* has a rectangular shape. The magnetic core 41 rectangular in plan view may have a vertical length a, the height b, and a horizontal length c. The top surface 40*a* and the bottom surface 40*b* are each defined by the vertical length a and the horizontal length c. The height b is also the interval between the top surface 40*a* and the bottom surface 40*b*. In this case, of all the external dimensions of the magnetic core 41, the height b is the shortest. The vertical length a and the horizontal length c are not particularly limited to any lengths, as long as the vertical length a and the horizontal length c are longer than the height b. That is, a dimension of the magnetic core 41, the dimension being parallel to the penetration direction of the terminal opening 41*a* through which the intermediate portion of the W-phase output terminal 24*c* passes, is the shortest. For example, when the magnetic core 41 has a circular shape in plan view, the vertical length a and the horizontal length c are both the same length and are the diameter of the magnetic core 41.

The measurement opening 41*b* is a gap in the magnetic core 41 formed in the shape of the letter "C". The measurement opening 41*b* includes a pair of opposite surfaces forming the gap. The pair of opposite surfaces may be parallel to each other and may be flat surfaces. The width in the measurement opening 41*b* in the ±X directions (the interval between the pair of opposite surfaces) is about the width of the Hall element 42, which will be described below.

The magnetic core 41 as described above is disposed in the frame portion 21 (near the outer wall 21*c*) of the case 20 disposed on the top plate 31, with the top surface 40*a* facing toward the front surface of the frame portion 21 and with the bottom surface 40*b* facing toward the top plate 31. The magnetic core 41 is formed on the frame portion 21 such that the height b is parallel to the vertical direction with respect to the cooling surface 31*g* of the top plate 31. In addition, in the present embodiment, the measurement opening 41*b* of the magnetic core 41 faces toward the outer wall 21*c*. Alternatively, the measurement opening 41*b* may face any one of the outer walls 21*a*, 21*b*, and 21*d*, depending on the wiring of the Hall element 42, which will be described below. The magnetic core 41 as described above is embedded into the frame portion 21 such that the shortest external dimension of the magnetic core 41 is parallel to the vertical direction (the Z direction) with respect to the top plate 31. That is, the magnetic core 41 is embedded in the frame portion 21 such that the penetration direction of the terminal opening 41*a* is perpendicular to the cooling surface 31*g* of the top plate 31.

In the case of this magnetic core 41, for example, the W-phase output terminal 24*c* extends toward the outer wall 21*c* inside the frame portion 21 from the unit storage portion 21*g* in parallel to the top surface 40*a* of the magnetic core 41 over the top surface 40*a*. Next, the W-phase output terminal 24*c* bends in the −Z direction, and an intermediate portion thereof passes through the terminal opening 41*a* of the magnetic core 41 from the top surface 40*a* to the bottom surface 40*b*. The other end of the W-phase output terminal 24*c* extends from a portion below and in parallel to the bottom surface 40*b* of the magnetic core 41 toward the outer wall 21*c* and extends from the outer wall 21*c* to the outside.

The Hall element 42 is disposed in the measurement opening 41*b* of the magnetic core 41. While not illustrated, a current source for supplying a voltage is electrically connected to the Hall element 42. In addition, a wiring for outputting the generated current to the outside is electrically connected to the Hall element 42. The Hall element 42 is an element through which a current flows when a magnetic flux from the outside passes through the Hall element 42. That is, the Hall element 42 flows a current based on the Hall effect. Specifically, if a magnetic flux from the outside passes through the Hall element 42 during application of a voltage to the Hall element 42, a current is generated in a direction perpendicular to the voltage direction and the magnetic field direction. The Hall element 42 as described above is, for example, made of a material containing any one of indium antimonide, indium arsenide, and gallium arsenide as its main component. A slit (not illustrated) for mounting the Hall element 42 in the measurement opening 41*b* is formed in the frame portion 21.

The output current flows in the −Z direction through the W-phase output terminal 24*c* that passes through the terminal opening 41*a* of the magnetic core 41. As a result, a magnetic flux is generated along the magnetic core 41 in the magnetic core 41. When the magnetic flux passes through the measurement opening 41*b*, the magnetic flux also passes through the Hall element 42. If the magnetic flux as described above passes through the Hall element 42 during application of a voltage to the Hall element 42, a current flows based on the Hall effect. Based on this current, the amount of the current flowing through the W-phase output terminal 24*c* is detected.

Figure 12:
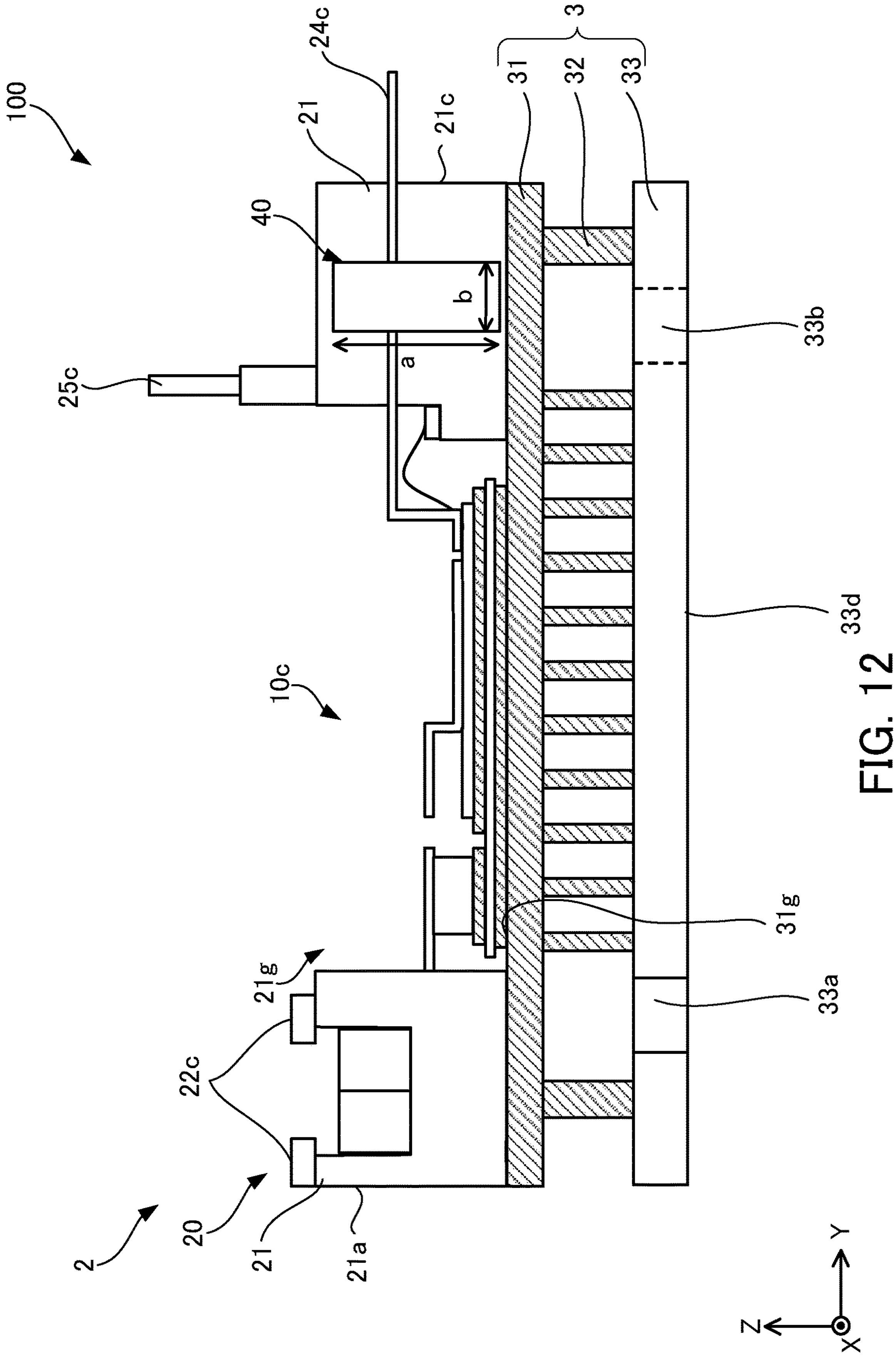
FIG. 12 is a sectional view of a semiconductor device according to a reference example.

Hereinafter, a reference example, which will be compared with the semiconductor device 1 according to the first embodiment, will be described with reference to FIG. 12. FIG. 12 is a sectional view of a semiconductor device according to the reference example. In the case of this semiconductor device 100 illustrated in FIG. 12, unlike the semiconductor device 1 according to the first embodiment, an individual current sensor 40 is embedded in a frame portion 21 such that the penetration direction of a terminal opening 41*a* is parallel to a cooling surface 31*g* of a top plate 31. Thus, a U-phase output terminal 24*a*, a V-phase output terminal 24*b*, and a W-phase output terminal 24*c* extend in parallel to the cooling surface 31*g* of the top plate 31 from unit storage portions 21*e*, 21*f*, and 21*g* toward an outer wall 21*c* and are inserted into their respective terminal openings 41*a*. Other components of the semiconductor device 100 are the same as those of the semiconductor device 1.

The ±Z direction height of the frame portion 21 of the semiconductor device 100 is greater than the ±Z direction height of the frame portion 21 of the semiconductor device 1 according to the first embodiment. That is, the thickness of the semiconductor device 100 is greater than that of the semiconductor device 1 according to the first embodiment.

The above semiconductor device 1 includes: the semiconductor chips 12 having output electrodes, which are the main electrodes 12*b*, on their respective front surfaces; the insulated circuit boards 11 on which the semiconductor chips 12 are disposed; the U-phase output terminal 24*a*, the V-phase output terminal 24*b*, and the W-phase output terminal 24*c*, each of which is electrically connected to a corresponding one of the main electrodes 12*b*; the cooling device 3 including the top plate 31 on which the insulated circuit boards 11 are disposed; and the case 20. The case 20 includes the frame portion 21 which has a frame shape in plan view, which includes the open unit storage portions 21*e* to 21*g* in which the insulated circuit boards 11 are stored, which is disposed on the top plate 31, and through which the U-phase output terminal 24*a*, the V-phase output terminal 24*b*, the W-phase output terminal 24*c* extend from the unit storage portions 21*e* to 21*g* to the outside. The case 20 also includes the current sensors which are embedded in the frame portion 21 and which detect output currents flowing through their respective U-phase output terminal 24*a*, V-phase output terminal 24*b*, and W-phase output terminal 24*c*. The individual current sensor 40 is embedded in the frame portion 21 such that the shortest external dimension of the current sensor 40 is parallel to the vertical direction with respect to the top plate 31. Because the frame portion 21 including the current sensors 40 is formed to be thinner, the case 20 is also formed to be thinner, and as a result, reduction in size of the semiconductor device 1 is achieved.

Second Embodiment

Figure 13:
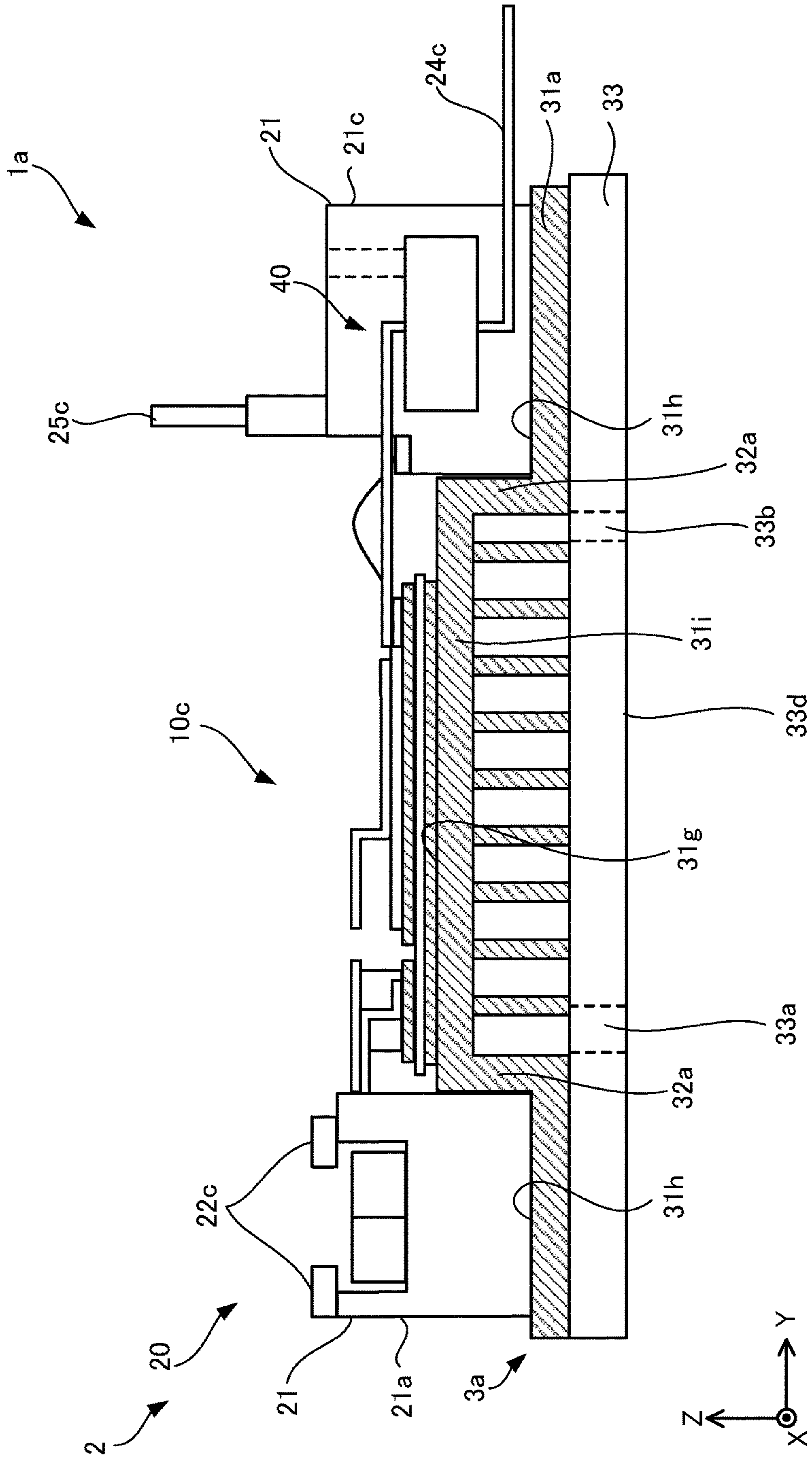
FIG. 13 is a sectional view of a semiconductor device according to a second embodiment.
Figure 14:
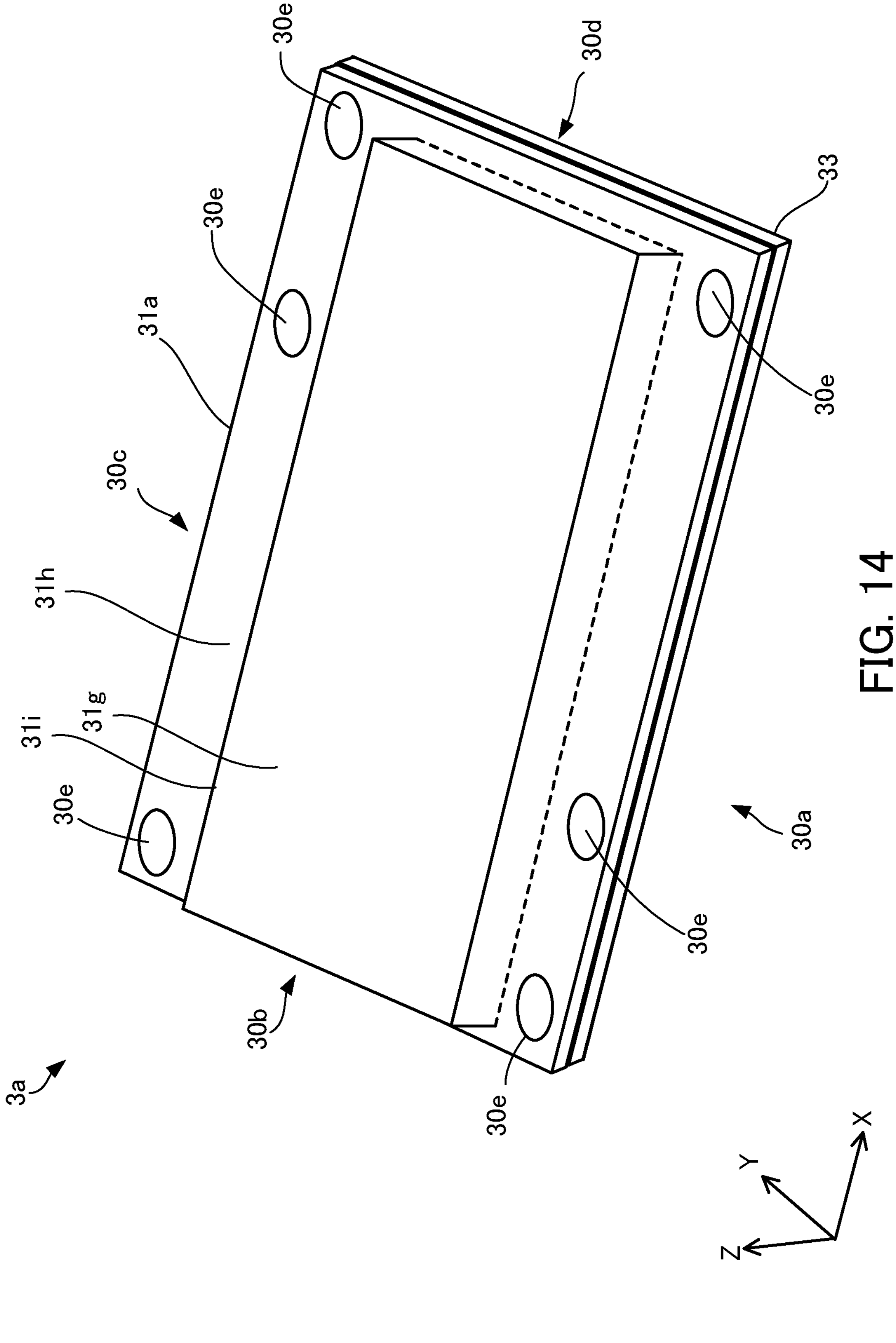
FIG. 14 is a perspective view of a cooling device included in the semiconductor device according to the second embodiment.

A semiconductor device 1*a* according to the second embodiment will be described with reference to FIGS. 13 and 14. FIG. 13 is a sectional view of the semiconductor device according to the second embodiment. FIG. 14 is a perspective view of a cooling device included in the semiconductor device according to the second embodiment.

The semiconductor device 1*a* differs from the semiconductor device 1 according to the first embodiment in that a frame portion area (an outer frame portion 31*h*, which will be described below) outside a cooling area 31*b* (the inner side of a side wall 32) of a top plate 31 of a cooling device 3*a* is concave in the −Z direction from the cooling area 31*b*.

That is, the top plate 31 of the cooling device 3*a* included in the semiconductor device 1*a* includes a cooling portion 31*i*, a side portion 32*a*, and the outer frame portion 31*h*. The cooling portion 31*i* corresponds to the flow path area 31*a* surrounded by the side wall 32 on the top plate 31 according to the first embodiment. The front surface of the cooling portion 31*i* is a flat cooling surface 31*g*, and the semiconductor units 10*a*, 10*b*, and 10*c* are disposed on the front surface. As in the first embodiment, a plurality of heat dissipation fins 34 are formed on the rear surface of the cooling portion 31*i* (the surface facing a cooling bottom plate 33).

The outer frame portion 31*h* is concave in the −Z direction from the cooling portion 31*i* in side view and is a flat surface. Thus, the outer frame portion 31*h* has an open area facing the cooling portion 31*i* in plan view. The side portion 32*a* continuously connects the outer periphery of the cooling portion 31*i* and the opening of the outer frame portions 31*h*. That is, the plurality of heat dissipation fins 34 formed on the rear surface of the cooling portion 31*i* are surrounded by the side portion 32*a*. The side portion 32*a* is perpendicular to the cooling portion 31*i* and the outer frame portion 31*h*. The level difference between the cooling portion 31*i* and the outer frame portion 31*h* corresponds to the height of the side portion 32*a*. Thus, a flow path area 31*a* of the top plate 31 according to the second embodiment is determined by the cooling portion 31*i* and the side portion 32*a*. As in the first embodiment, the flow path area 31*a* determined as described above includes the cooling area 31*b* and communication areas 31*c* and 31*d*. In addition, the shape of the cooling portion 31*i* and the opening of the outer frame portion 31*h* in plan view may be octagonal as illustrated in FIG. 8. In this case, the side portion 32*a* also has an octagonal shape that matches the shape of the cooling portion 31*i* and the opening of the outer frame portion 31*h* in plan view.

In addition, the cooling bottom plate 33 is attached to the top plate 31 as described above. As a result, the flow path area 31*a* is surrounded by the cooling portion 31*i*, the side portion 32*a*, and the cooling bottom plate 33. An outlet 33*b* and an inlet 33*a* are formed in the cooling bottom plate 33 such that the outlet 33*b* and the inlet 33*a* are located in the communication areas 31*c* and 31*d* included in the cooling area 31*b* when the cooling bottom plate 33 is attached to the top plate 31.

As in the first embodiment, semiconductor units 10*a* to 10*c* are attached to the cooling surface 31*g* of the cooling portion 31*i* of the cooling device 3*a* as described above. In addition, the rear surface of unit storage portions 21*e*, 21*f*, and 21*g* of a frame portion 21 included in a case 20 of a semiconductor module 2 is concave such that the cooling portion 31*i* and the side portion 32*a* of the top plate 31 are fitted. The protruding cooling portion 31*i* of the cooling device 3*a* is fitted to the rear surface of the frame portion 21 of the case 20 as described above. Thus, the frame portion 21 is disposed on the outer frame portion 31*h* of the top plate 31 and surrounds the side portion 32*a*. In addition, current sensors 40 embedded into the frame portion 21 are disposed above the outer frame portion 31*h* of the top plate 31 in the vertical direction.

As in the first embodiment, terminal openings 41*a* of the current sensors 40 are embedded into the case 20 of the semiconductor device 1*a* such that the terminal openings 41*a* are parallel to the vertical direction with respect to the top plate 31. Thus, the frame portion 21 including the current sensors 40 is formed to be thinner. In addition, in the case of the cooling device 3*a* of the semiconductor device 1*a*, the outer frame portion 31*h* of the top plate 31 on which the case 20 is disposed is concave downward from the cooling portion 31*i*. Thus, the case 20 and the cooling device 3*a* are formed to be thinner than those according to the first embodiment. Thus, the semiconductor device 1*a* is formed to be smaller than the semiconductor device 1 according to the first embodiment.

The disclosed technique achieves thinning of a semiconductor device including current detection units and consequently achieves downsizing of the semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:

a semiconductor chip having an output electrode on a front surface thereof;

an insulated circuit board having the semiconductor chip disposed on a front surface thereof;

an output terminal electrically connected to the output electrode and having a top surface and a bottom surface;

a cooling device including a cooling top plate having a cooling top surface and a cooling bottom surface, the cooling top surface having a cooling area on which the insulated circuit board is disposed; and a case including a frame portion having a frame shape in a plan view of the semiconductor device and being disposed on the cooling top surface, the frame portion including an open storage area in which the insulated circuit board is stored, the output terminal extending from the storage area to an outside of the case; and a current detection unit for detecting an output current flowing through the output terminal, the current detection unit being embedded within the frame portion, wherein the current detection unit has a detection top surface facing a top surface of the frame portion of the case and being parallel to the top surface of the output terminal, and a detection bottom surface facing the cooling top surface of the cooling device and being parallel to the bottom surface of the output terminal;

the current detection unit is a three-dimensional object having a first thickness, a second thickness and a third thickness respectively in a first direction, a second direction and a third direction perpendicular to one another, the first direction being from the detection bottom surface to the detection top surface and being perpendicular to the cooling top surface, the first thickness being equal to or smaller than the second thickness, the first thickness being equal to or smaller than the third thickness;

the current detection unit further includes:

a magnetic core extending along a periphery of a penetration area and having a gap in a direction that the magnetic core extends such that the magnetic core partially surrounds the penetration area in a shape of the letter "C" in the plan view, and a Hall element disposed in the gap; and the output terminal has an intermediate portion that passes through the penetration area of the magnetic core in the first direction.

2. The semiconductor device according to claim 1, wherein the insulated circuit board includes a first wiring plate on which the semiconductor chip is disposed and a second wiring plate to which the output electrode of the semiconductor chip is electrically connected, the first wiring plate and the second wiring plate being disposed on the front surface of the insulated circuit board, and the output terminal has two ends, one of the two ends of the output terminal being connected to the second wiring plate, and the other one of the two ends of the output terminal extending to the outside of the case in the second direction.

3. The semiconductor device according to claim 1, wherein the output terminal further has a first side portion that extends along the detection top surface, and a second side portion that extends along the detection bottom surface to the outside of the case.

4. The semiconductor device according to claim 3, wherein the cooling top surface of the cooling top plate further includes a frame portion area surrounding the cooling area, the frame portion being disposed in the frame portion area, and the semiconductor device further includes:

a cooling bottom plate disposed at a side of the cooling bottom surface of the cooling top plate to face the cooling top plate, the cooling bottom plate having an inlet and an outlet for refrigerant at positions overlapping the frame portion area of the cooling top surface in the plan view, a plurality of heat dissipation fins provided between the cooling top plate and the cooling bottom plate at positions overlapping the cooling area of the cooling top surface in the plan view, and a side wall disposed between the cooling top plate and the cooling bottom plate so as to surround the plurality of heat dissipation fins, the inlet and the outlet.

5. A semiconductor device according to claim 1, wherein the output terminal further includes a first side portion and a second side portion parallel to a top surface of the frame portion of the case, the intermediate portion connecting the first side portion to the second side portion, the entirety current detection unit being located between the first side portion and the second side portion.

6. A semiconductor device according to claim 2, wherein the frame portion of the case includes an inner wall facing the open storage area and an outer wall opposite to the inner wall, the inner wall and the outer wall being parallel to the first direction, and the current detection unit being embedded between the inner wall and the outer wall of the frame portion, wherein the other one of the two ends of the output terminal is exposed from the outer wall and extends outside in the second direction.

7. A semiconductor device, comprising:

a semiconductor chip having an output electrode on a front surface thereof;

an insulated circuit board having the semiconductor chip disposed on a front surface thereof;

an output terminal electrically connected to the output electrode;

a cooling device including a cooling top plate having a cooling top surface and a cooling bottom surface, the cooling top surface of the cooling top plate having a cooling area in which the insulated circuit board is disposed and a frame portion area surrounding the cooling area, the frame portion being disposed in the frame portion area, and a cooling bottom plate disposed at a side of the cooling bottom surface of the cooling top plate to face the cooling top plate, the cooling bottom plate having an inlet and an outlet for refrigerant at positions overlapping the cooling area of the cooling top surface in a plan view of the semiconductor device;

a case including a frame portion having a frame shape in the plan view and being disposed on the cooling top surface, the frame portion including an open storage area in which the insulated circuit board is stored, the output terminal extending from the storage area to an outside of the case;

a current detection unit for detecting an output current flowing through the output terminal, the current detection unit being embedded within the frame portion such that a shortest external dimension of the current detection unit is parallel to a first direction that is perpendicular to the cooling area of the cooling top surface; and a plurality of heat dissipation fins provided between the cooling top plate and the cooling bottom plate at positions overlapping the cooling area of the cooling top surface in the plan view, wherein the frame portion area is located closer to the cooling bottom plate than is the cooling area.

8. The semiconductor device according to claim 7, wherein the current detection unit is disposed above the frame portion area of the cooling top surface.

* * * * *